US011698388B2

(12) United States Patent  
Darmanin et al.

(10) Patent No.: US 11,698,388 B2  
(45) Date of Patent: Jul. 11, 2023

(54) MICROMECHANICAL DEVICE WITH ELASTIC ASSEMBLY HAVING VARIABLE ELASTIC CONSTANT

(71) Applicant: STMicroelectronics S.r.l., Agrate Brianza (IT)

(72) Inventors: Jean Marie Darmanin, Milan (IT); Carlo Valzasina, Gessate (IT); Alessandro Tocchio, Milan (IT); Gabriele Gattere, Castronno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/122,793

(22) Filed: Dec. 15, 2020

(65) Prior Publication Data

US 2021/0190814 A1 Jun. 24, 2021

(30) Foreign Application Priority Data

Dec. 18, 2019 (IT) .......................... 102019000024475

(51) Int. Cl.
*G01P 15/125* (2006.01)
*G01P 15/00* (2006.01)

(52) U.S. Cl.
CPC ................................ *G01P 15/125* (2013.01)

(58) Field of Classification Search
CPC ..... G01P 2015/0851; G01P 2015/0874; B81B 3/0013; B81C 1/0096; B81C 1/00984
See application file for complete search history.

(56) References Cited

U.S. PATENT DOCUMENTS

| | | | |
|---|---|---|---|
| 6,865,944 B2* | 3/2005 | Glenn | B81B 3/0051 |
| | | | 73/504.12 |
| 9,702,889 B2* | 7/2017 | Lin | G01P 15/18 |
| 2004/0182157 A1* | 9/2004 | Sakai | G01P 15/125 |
| | | | 73/514.32 |
| 2006/0107743 A1 | 5/2006 | Ullmann | |
| 2012/0160029 A1* | 6/2012 | Yamaguchi | G01P 15/125 |
| | | | 73/514.32 |
| 2014/0260613 A1 | 9/2014 | Qiu et al. | |
| 2015/0205092 A1 | 7/2015 | Sasagawa et al. | |
| 2015/0316582 A1* | 11/2015 | Tanaka | G01P 15/125 |
| | | | 73/514.32 |

(Continued)

*Primary Examiner* — Jill E Culler
*Assistant Examiner* — Ruben C Parco, Jr.
(74) *Attorney, Agent, or Firm* — Seed Intellectual Property Law Group LLP

(57) ABSTRACT

A micromechanical device includes a semiconductor body, a first mobile structure, an elastic assembly, coupled to the first mobile structure and to the semiconductor body and adapted to undergo deformation in a direction, and at least one abutment element. The elastic assembly is configured to enable an oscillation of the first mobile structure as a function of a force applied thereto. The first mobile structure, the abutment element and the elastic assembly are arranged with respect to one another in such a way that: when the force is lower than a force threshold, the elastic assembly operates with a first elastic constant; and when the force is greater than the threshold force, then the first mobile structure is in contact with the abutment element, and a deformation of the elastic assembly is generated, which operates with a second elastic constant different from the first elastic constant.

18 Claims, 15 Drawing Sheets

(56) References Cited

U.S. PATENT DOCUMENTS

| | | | |
|---|---|---|---|
| 2016/0349056 A1 | 12/2016 | Thompson et al. | |
| 2017/0082519 A1* | 3/2017 | Blomqvist | B81B 7/0016 |
| 2018/0045515 A1* | 2/2018 | Simoni | G01P 15/0802 |
| 2018/0328959 A1* | 11/2018 | Classen | B81B 5/00 |
| 2019/0187170 A1 | 6/2019 | Painter et al. | |

* cited by examiner

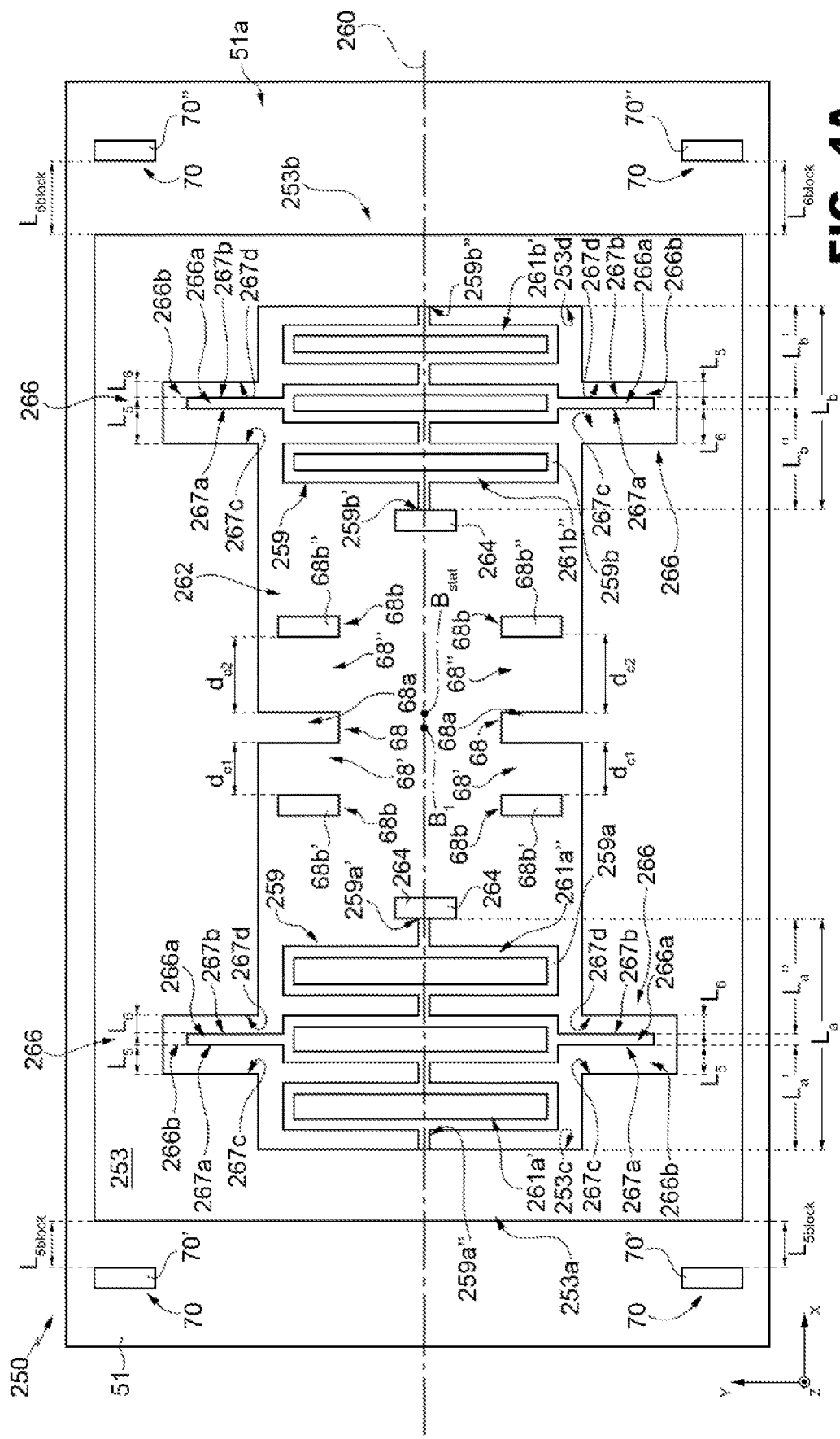

MICROMECHANICAL DEVICE WITH ELASTIC ASSEMBLY HAVING VARIABLE ELASTIC CONSTANT

BACKGROUND

Technical Field

The present disclosure relates to a micromechanical device with an elastic assembly having a variable elastic constant.

Description of the Related Art

As is known, there is a desire to detect and measure effectively accelerations and shocks via sensors having small dimensions that can be easily integrated. Common applications include monitoring of shocks in electronic devices, such as mobile phones and smartwatches, for example for detecting car accidents or cases of people falling on the ground as a result of feeling unwell or fainting or because they suffer from an illness.

Currently, available on the market are low-G sensors (such as accelerometers and gyroscopes) adapted to detect low accelerations (for example, with a full-scale range of 16 g or 32 g) and high-G sensors adapted to detect high accelerations (for example, with a full-scale range of 128 g). The former are used for detecting usual movements of operators provided with the electronic device that integrates the sensors (such as approach of the mobile phone to the operator's ear, or movement of the wrist to which the smartwatch is connected), whereas the latter enable detection of high-intensity accelerations (and therefore, anomalous events).

In order to enable an electronic device to detect both low accelerations and high accelerations, known solutions envisage integration in the electronic device of both types of accelerometer. However, the simultaneous presence in a same electronic device of two different accelerometers entails disadvantages such as a larger number of pads necessary and a higher complexity in the control circuitry (for example, dedicated ASICs, PCBs, or CPUs, etc.), and more in general a greater integration area, a lower portability of the electronic device, and a higher manufacturing cost.

Given the drawbacks, the patent document US2006/107743A1 discloses the structure of an accelerometer that enables implementation of two different sensitivities in respective and different operating modes. In particular, the above accelerometer includes, in one embodiment (designated in FIG. 1A by the reference number $1a$), a seismic mass 2 fixed to a first end $3a$ of a first spring element 3 having an elongated shape. The first spring element 3 is moreover fixed to a support 5 at a second end $3b$ thereof, opposite to the first end $3a$. A second spring element 4, having an elongated shape and having a first end $4a$ and a second end $4b$ opposite to one another, is moreover fixed to the support 5 at its second end $4b$. The first and second spring elements 3, 4 have a main extension along a first direction orthogonal to a main extension of the support 5 (for example, orthogonal to a surface of the support 5), and are therefore set parallel to one another and with respect to the first direction. In addition, they are aligned with one another in a direction perpendicular to a second direction orthogonal to the first direction. In use, the first spring element 3 is deflected in a direction perpendicular to its main extension by a force F (for example, a force of gravity) acting in the second direction. When the force F is equal to a threshold force $F_{th}$, the first spring element 3 presents a deflection such that it comes into contact, at a portion of a bottom surface $3c$ thereof, with the first end $4a$ of the second spring element 4. For forces F lower than the threshold force $F_{th}$, the accelerometer $1a$ has a first value $K_1$ of elastic constant (that depends just upon the characteristics of the first spring element 3); for forces F higher than the threshold force $F_{th}$, the accelerometer $1a$ has, instead, a second value $K_2$ of elastic constant (that depends upon the characteristics of the second spring element 4) greater than the first value $K_1$. The presence of the second spring element 4 therefore enables modification of the stiffness of the accelerometer $1a$ as a function of the force F applied.

According to a different embodiment of the accelerometer, disclosed in the same patent document US2006/107743A1 (designated in FIG. 1B by the reference number $1b$), the seismic mass 2 is connected to the support 5 via a third spring element 7, which that has a pyramidal tapering from the end in contact with the support 5 to the end in contact with the seismic mass 2. The shape of the third spring element 7 makes it possible to obtain, in use, a non-linear profile of the elastic constant, and therefore a stiffness of the accelerometer $1b$ that varies as a function (in particular, logarithmically) of the force F applied.

However, the accelerometer $1a$ presents a low mechanical stability since, during an event of shock or in any case of marked acceleration, the spring elements 3, 4 may be overstressed and undergo damage or failure due to mutual contact. Instead, in the case of the accelerometer $1b$, the real plot of stiffness is difficult to predict theoretically in an accurate way since it depends upon a multiplicity of structural factors, factors of use, and process factors.

BRIEF SUMMARY

In various embodiments, the present disclosure provides a micromechanical device that will overcome the problems of the prior art.

In one or more embodiments of the present disclosure, a micromechanical device is provided that includes a semiconductor body; a first mobile structure, having a first mass, configured to oscillate relative to the semiconductor body in a direction belonging to a plane; an elastic assembly, having an elastic constant, mechanically coupled to the first mobile structure and to the semiconductor body, and configured to expand and contract in the direction; and at least one abutment element. The elastic assembly is configured to enable the oscillation of the first mobile structure as a function of a force applied to the first mobile structure in the direction. The first mobile structure, the abutment element, and the elastic assembly are arranged with respect to one another in such a way that: when the force applied to the first mobile structure is lower than an abutment-force threshold, then the first mobile structure is not in contact with the abutment element, and the elastic assembly operates with a first elastic constant; and when the force applied to the first mobile structure is greater than the abutment-force threshold, then the first mobile structure is in contact with the abutment element and, under the action of the applied force, a deformation of the elastic assembly is generated such that the elastic assembly operates with a second elastic constant different from the first elastic constant.

BRIEF DESCRIPTION OF THE SEVERAL VIEWS OF THE DRAWINGS

For a better understanding of the present disclosure, a preferred embodiment thereof is now described, purely by way of non-limiting example, with reference to the attached drawings, wherein:

FIGS. 4A and 4B are top views of the micromechanical device of FIG. 4, in respective operating modes;

DETAILED DESCRIPTION

In particular, the figures are illustrated with reference to a triaxial cartesian system defined by a first axis X, a second axis Y, and a third axis Z, orthogonal to one another.

In the ensuing description, elements that are common to the different embodiments are designated by the same reference numbers.

Moreover, in the ensuing description, the term "substantially" is used to refer to a property that is considered verified to a first order. For instance, if two elements moving with respect to a reference point are said to be "substantially" fixed with respect to one another, it is meant that, even though there may exist a relative movement between them, this relative movement is negligible as compared to the movement with respect to the reference point (for example, the relative movement is less than 5% of the movement of each element with respect to the reference point). Likewise, if an element is said to present a "substantially" zero deformation along one axis, it is meant that a possible deformation of the element is negligible as compared to the extension of the element itself along the aforesaid axis (for example, the deformation is less than 5% of the extension of the element along said axis).

Figure 1A:
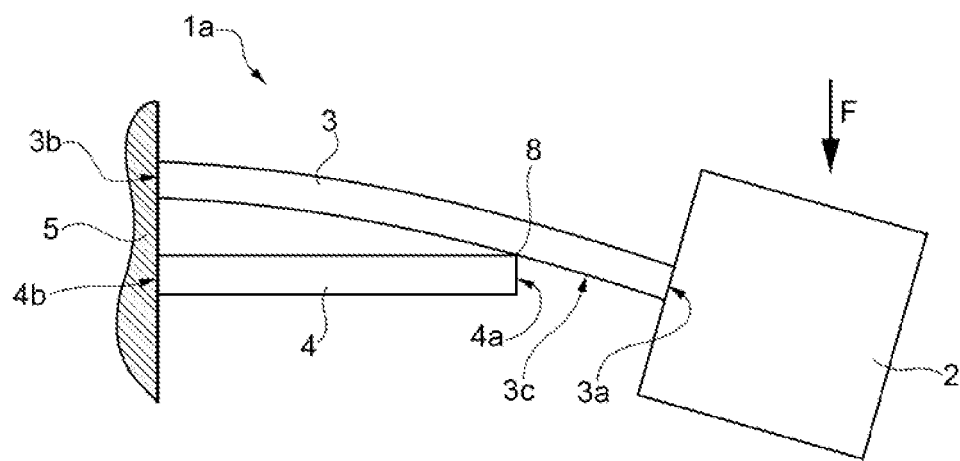
FIGS. 1A and 1B are cross-sectional views of respective accelerometers of a known type.
Figure 1B:
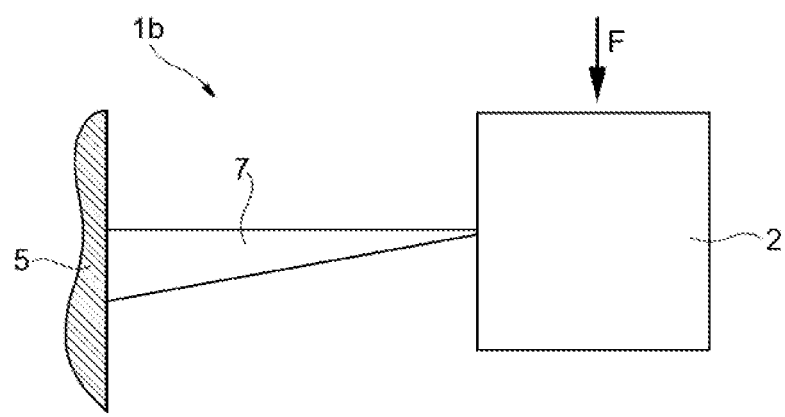
Figure 2:
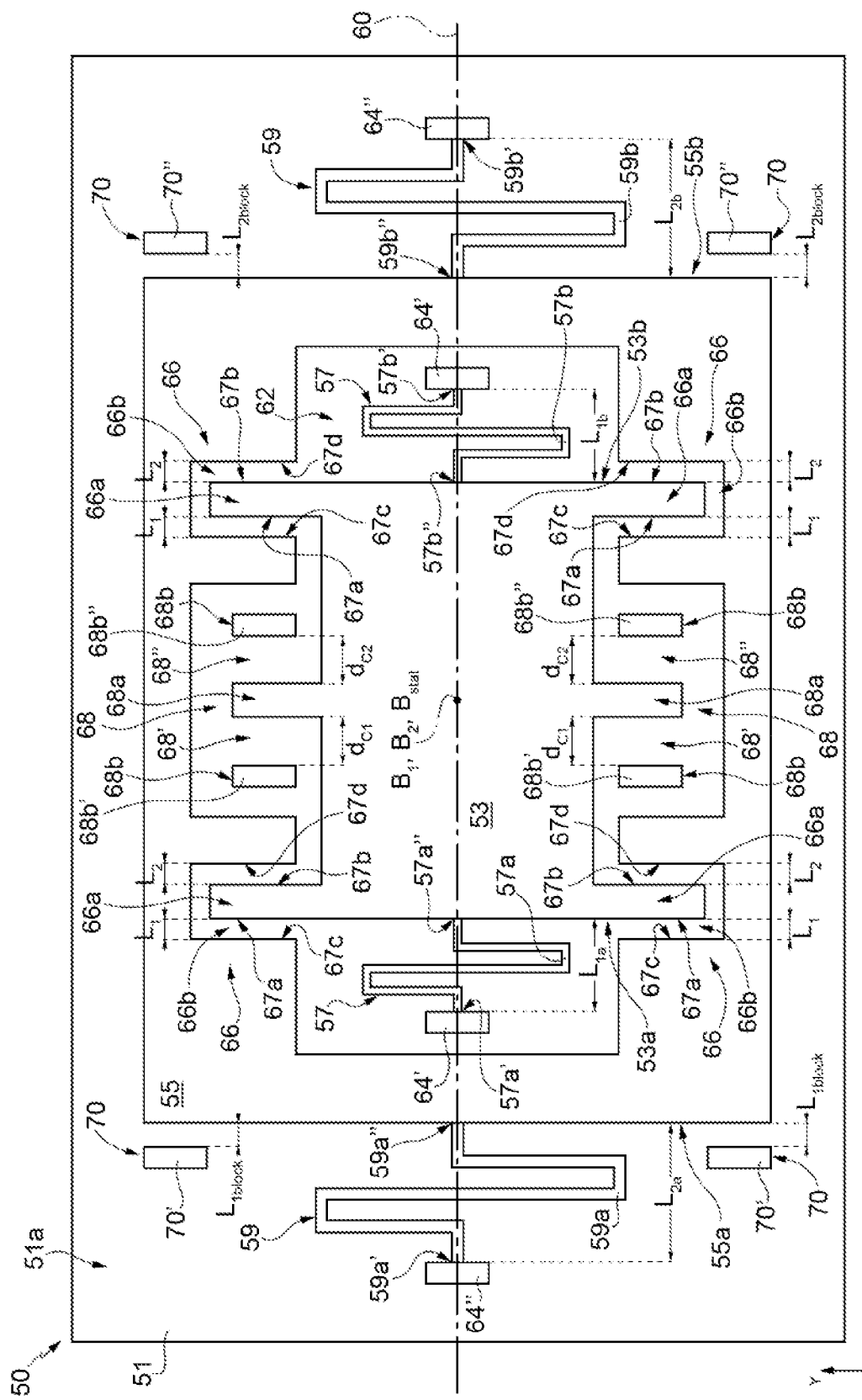
FIG. 2 is a top view of a micromechanical device, according to one embodiment of the present disclosure.

FIG. 2 shows a micromechanical device 50 configured to detect accelerations (hereinafter also referred to as sensor 50), according to one embodiment. FIG. 2 is a top view (i.e., in the plane XY) of the sensor 50. Illustrated in FIG. 2 are just the elements useful for an understanding of the present embodiment, and elements or components that, albeit present in the finished sensor, are not important for the present disclosure are not illustrated.

The sensor 50 comprises a semiconductor body 51 of semiconductor material, such as silicon (Si), having a surface 51a extending parallel to a first plane XY defined by the first axis X and by the second axis Y (i.e., the third axis Z is orthogonal to the surface 51a). The sensor 50 further comprises a first mobile structure 53 having a first mass $M_1$, and a second mobile structure 55 having a second mass $M_2$, greater than the first mass $M_1$. In what follows, the first mobile structure 53 will be referred to as "first seismic mass", and the second mobile structure 55 will be referred to as "second seismic mass".

Both the first seismic mass 53 and the second seismic mass 55 are, for example, of semiconductor material (such as silicon or polysilicon) and extend parallel to the surface 51a of the semiconductor body 51, at a different height, along the axis Z, with respect to the height of the surface 51a.

The first seismic mass 53 is physically coupled to the semiconductor body 51 via a first spring assembly 57 (in detail, a first spring, or first elastic element, 57a of the first spring assembly 57 and a second spring, or second elastic element, 57b of the first spring assembly 57), whereas the second seismic mass 55 is physically coupled to the semiconductor body 51 via a second spring assembly 59 (in detail, a first spring, or first elastic element, 59a of the second spring assembly 59 and a second spring, or second elastic element, 59b of the second spring assembly 59). Both the first spring assembly 57 and the second spring assembly 59 are, for example, of semiconductor material (such as silicon or polysilicon) and undergo deformation (i.e., they lengthen/shorten) along the first axis X. In other words, both the first spring assembly 57 and the second spring assembly 59 have respective axes along which deformation occurs parallel to the first axis X. In addition, deformation of the first and second spring assemblies 57, 59 occurs along a same direction of deformation 60.

In the embodiment described by way of example, both the first portions 57a, 59a and the second portions 57b, 59b of the elastic elements 57, 59 are serpentine springs. In particular, such serpentine springs are of a planar type and are obtained with MEMS technology (i.e., by methods of machining of semiconductors). In greater detail, said serpentine springs may include first portions, which extend parallel to one another and to the second axis Y, and second portions, which extend parallel to one another and to the first axis X. The first and second portions are connected to one another and are mutually arranged so as to form a serpentine path: each first portion is connected, at its ends that are opposite to one another along the second axis Y, to respective second portions; and each second portion is connected, at its ends that are opposite to one another along the first axis X, to respective first portions, except for two second portions (each of which is set at a respective end of said path along the first axis X and is joined to just one respective first portion).

Each spring 57a, 57b of the first spring assembly 57 has a respective first end 57a', 57b' and a respective second end 57a", 57b", which are opposite to one another along the first axis X. Each spring 59a, 59b of the second spring assembly 59 has a respective end 59a', 59b' and a respective end 59a", 59b", which are opposite to one another along the first axis X.

In particular, the distance, measured along the axis X, between the end 57a' and the end 57a" of the first spring 57a of the first spring assembly 57, is identified by the reference $L_{1a}$. The distance, measured along the axis X between the end 57b' and the end 57b" of the second spring 57b of the first spring assembly 57, is identified by the reference $L_{1b}$. The distance, measured along the axis X between the end 59a' and the end 59a" of the first spring 59a of the second spring assembly 59, is identified by the reference $L_{2a}$. The distance, measured along the axis X between the end 59b' and the end $59b''$ of the second spring $59b$ of the second spring assembly $59$, is identified by the reference $L_{2b}$.

The springs $57a$, $57b$ of the first spring assembly $57$ have respective first elastic constants $K_1$ (having the same value), and the springs $59a$, $59b$ of the second spring assembly $59$ have respective second elastic constants $K_2$ (having the same value as one another, but different from $K_1$, for example greater than $K_1$).

In the embodiment of FIG. 2, two springs $57a$, $57b$ are present so that the equivalent elastic constant of the first spring assembly 57 is given by $2K_1$, and two springs $59a$, $59b$ are present so that the equivalent elastic constant of the second spring assembly 59 is given by $2K_2$. In general, for any number N1 of springs of the first spring assembly 57, the equivalent elastic constant of the first spring assembly 57 is given by $N1 \cdot K_1$, and for any number N2 of springs of the second spring assembly 59, the equivalent elastic constant of the second spring assembly 59 is given by $N2 \cdot K_2$.

Each spring $57a$, $57b$ of the first spring assembly 57 is coupled, via the respective end $57a'$, $57b'$, to a respective first fixing element 64' coupled to the surface $51a$ of the semiconductor body 51 (in particular, each first fixing element 64' is fixed with respect to the surface of the semiconductor body 51). Each spring $57a$, $57b$ of the first spring assembly 57 is moreover coupled, at the respective end $57a''$, $57b''$, to the first seismic mass 53. In detail, in the embodiment discussed by way of example, the first seismic mass 53 has a first lateral surface $53a$ and a second lateral surface $53b$ opposite to one another along the first axis X, and each end $57a''$, $57b''$ is fixed with respect to a respective one between the first and second lateral surfaces $53a$, $53b$. Consequently, the first seismic mass 53 is set, along the first axis X, between the first and second springs $57a$, $57b$ of the first spring assembly 57.

The second seismic mass 55 moreover has, in the view of FIG. 2, a cavity 62 that houses within it the first seismic mass 53, the first spring assembly 57, and the first fixing elements 64'.

Each spring $59a$, $59b$ of the second spring assembly 59 is coupled, via the respective end $59a'$, $59b'$, to a respective second fixing element 64'', which is in turn coupled to the semiconductor body 51 (in particular, the second fixing element 64'' is fixed with respect to the surface $51a$ of the semiconductor body 51). Each spring $59a$, $59b$ of the second spring assembly 59 is moreover coupled, at the respective end $59a''$, $59b''$, to the second seismic mass 55. In detail, in the embodiment discussed, the second seismic mass 55 has a first lateral surface $55a$ and a second lateral surface $55b$ opposite to one another along the first axis X, and each end $59a''$, $59b''$ is fixed with respect to a respective one between the first and second lateral surface $55a$, $55b$. Consequently, the second seismic mass 55 is set, along the first axis X, between the first and second springs $59a$, $59b$ of the second spring assembly 59.

The first seismic mass 53 further includes a plurality of stopper elements $66a$ (for example, in FIG. 2, four stopper elements $66a$), and the second seismic mass 55 includes a respective plurality of housing elements $66b$ (for example, in FIG. 2, four housing elements $66b$). The stopper elements $66a$ and the housing elements $66b$ form an abutment assembly 66.

The stopper elements $66a$ are protrusions of the first seismic mass 53, whereas the housing elements $66b$ are respective portions of the second seismic mass 55, which present a respective cavity and/or recess. In the embodiment illustrated by way of example in FIG. 2, both the stopper elements (protrusions) $66a$ and the housing elements $66b$ (cavities) have a substantially rectangular shape with a main extension parallel to the second axis Y. In particular, the first and second seismic masses 53, 55 are arranged in such a way that each stopper element $66a$ extends within the cavity of each respective housing element $66b$ or, in other words, each stopper element $66a$ is partially surrounded by a respective housing element $66b$, to form a respective abutment assembly 66. In the absence of external forces acting along the axis X, each stopper element $66a$ is not in contact with the respective housing element $66b$. Each stopper element $66a$ has a first side wall $67a$ and a second side wall $67b$, opposite to one another along the first axis X, whereas each housing element $66b$ has a first side wall $67c$ and a second side wall $67d$, opposite to one another along the first axis X and facing the first side wall $67a$ and the second side wall $67a$, $67b$, respectively, of the respective stopper element $66a$. For each contact structure 66, the side walls $67a$, $67c$ are at a distance equal to a first length $L_1$ from one another, whereas the side walls $67b$, $67d$ are at a distance equal to a second length $L_2$ from one another.

Furthermore, the first seismic mass 53 includes one or more first electrodes $68a$ (mobile electrodes), such as protrusions (for example, having a substantially rectangular shape in the plane XY), which, in use, displace in a way fixed with respect to the first seismic mass 53. One or more second electrodes $68b$ (fixed electrodes) are fixed with respect to the semiconductor body 51, in particular to the surface $51a$.

Each of the second electrodes is further divided into a first portion $68b'$ and a second portion $68b''$, which are separate from one another. The first electrode $68a$ extends between the first portion $68b'$ and the second portion $68b''$. In greater detail, each of the first electrodes $68a$ faces, and is set between, the first portion $68b'$ of a respective second electrode $68b$ and the second portion $68b''$ of said respective second electrode $68b$.

The first and second electrodes $68a$, $68b$ form a measurement structure 68 of the sensor 50 adapted, in use, to detect in a capacitive way displacements along the first axis X of the first and second seismic masses 53, 55; these displacements are indicative of external forces (e.g., accelerations) that act on the sensor 50.

In particular, surfaces of the first electrode $68a$ and of the first portion $68b'$ of the second electrode $68b$ that directly face one another form a first capacitor 68'. Likewise, surfaces of the first electrode $68a$ and of the second portion $68b''$ of the second electrode $68b$ that directly face one another form a second capacitor 68''. The distance (along the axis X) between the first electrode $68a$ and the first portion $68b'$ is designated by the reference $d_{c1}$, whereas the distance between the first electrode $68a$ and the second portion $68b''$ is designated by the reference $d_{c2}$.

Moreover, first and second blocking elements 70', 70'' are fixed with respect to the semiconductor body 51 (in particular, to the surface $51a$ of the semiconductor body 51). FIG. 2 illustrates, by way of example, two blocking elements 70' that are located at a distance $L_{1block}$ along the first axis X from the first lateral surface $55a$ of the second seismic mass 55. FIG. 2 likewise illustrates two blocking elements 70'' that are set at a distance $L_{2block}$ along the first axis X from the second lateral surface $55b$ of the second seismic mass 55.

In detail, in order to prevent direct contact between the first electrode $68a$ and the portions $68b'$, $68b''$, the distance $d_{c1}$ is designed to have a value such that $d_{c1} > L_1 + L_{1block}$, and the distance $d_{c2}$ is designed to have a value such that $d_{c2} > L_2 + L_{2block}$.

During use of the sensor 50, the first electrode 68a is biased at a first voltage $V_1$, and the second electrode 68b is biased at a second voltage $V_2$. In particular, the first voltage $V_1$ and the second voltage $V_2$ are the same as one another ($V_1=V_2$).

Since, in use, the first and second distances $d_{c1}$, $d_{c2}$ vary as a function of the external force applied to the sensor 50 (which causes, as has been said, a displacement of the first seismic mass 53), it is possible to correlate the variation of capacitance of the capacitors 68', 68" to this applied force. The measurements of capacitance can be performed via techniques in themselves known, for example, via transimpedance amplifiers.

With the sensor 50 in the resting condition, no external force is applied to the sensor 50, and therefore both the first and second seismic masses 53, 55 are in the resting position.

The first seismic mass 53 has a first centroid $B_1$ and the second seismic mass 55 has a second centroid $B_2$. In the resting condition:

the first and second centroids $B_1$, $B_2$ coincide with one another in the plane XY ($B_1=B_2=B_{stat}$);
the first and second path lengths $L_1$, $L_2$ are the same as one another ($L_1=L_2=L_{stop}$);
the first and second distances $d_{c1}$, $d_{c2}$ are the same as one another ($d_{c1}=d_{c2}=d_{rest}$);
the first length $L_{1a}$ and the second length Lib are the same as one another ($L_{1a}=L_{1b}=L_{1rest}$);
the first length $L_{2a}$ and the second length $L_{2b}$ are the same as one another ($L_{2a}=L_{2b}=L_{2rest}$); and
the first distance $L_{1block}$ and the second distance $L_{2block}$ are the same as one another ($L_{1block}=L_{2block}=L_{blockmax}$).

Figure 2A:
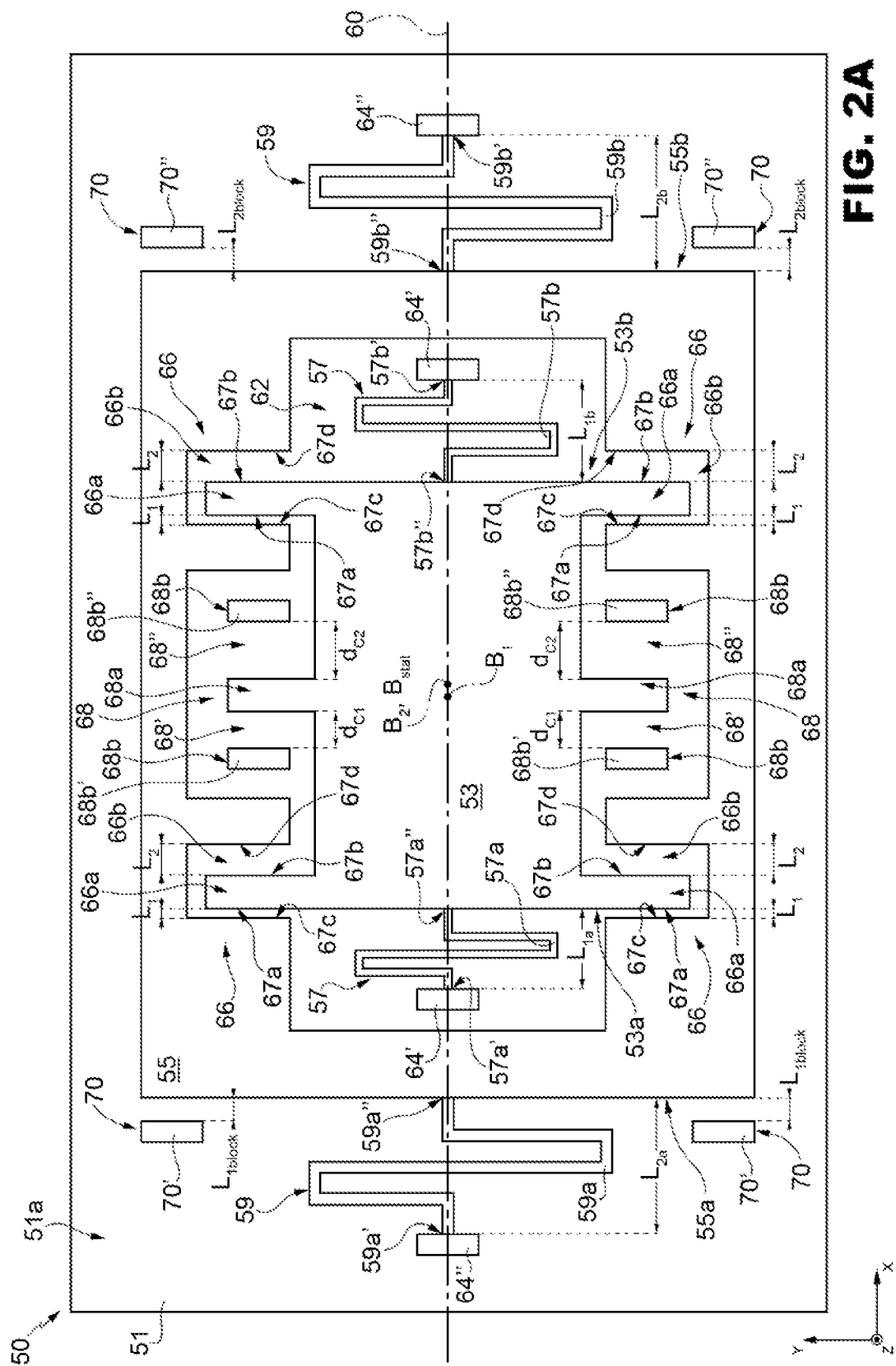
FIGS. 2A and 2B illustrate the micromechanical device of FIG. 2 in respective operating modes.

FIG. 2A shows the sensor 50 in a first operating condition, where an external force (having a first value $F_1$ lower than a threshold value $F_2$) is applied to the sensor 50. In the present description, the external force is considered, by way of example, as a force acting in the direction of the first axis X (in FIG. 2A, from left to right); however, what is described hereinafter applies in a way in itself evident also to the case where the external force acts in the opposite direction. On account of its inertia, the first seismic mass 53 undergoes an apparent force equal to the external force applied to the sensor 50, but in an opposite direction (since the reference system illustrated in FIG. 2A and fixed with respect to the semiconductor body 51 is not inertial). The apparent force causes a relative movement of the first seismic mass 53 with respect to the semiconductor body 51. In particular:

in the plane XY, the first centroid $B_1$ is displaced along the first axis X with respect to the position $B_{stat}$ of the centroids at rest, whereas the second centroid $B_2$ substantially coincides with the position $B_{stat}$ of the centroids at rest;
the first length $L_1$ is less than $L_{stop}$, and the second length $L_2$ is greater than $L_{stop}$;
the first distance da is less than the distance $d_{rest}$, and the second distance $d_{c2}$ is greater than the distance $d_{rest}$;
the first length $L_{1a}$ is less than the length at rest $L_{1rest}$, and the second length Lib is greater than the length at rest $L_{1rest}$;
the first length $L_{2a}$ and the second length $L_{2b}$ are substantially the same as one another and substantially equal to the length at rest $L_{1rest}$; and
the first distance $L_{1block}$ and the second distance $L_{2block}$ are the same as one another and equal to the distance $L_{blockmax}$.

Therefore, considering by way of example N1=1, N2=1, in the first operating condition of FIG. 2A, the sensor 50 has a resonance pulsation $\omega_{res}$ according to the following mathematical expression:

$$\omega_{res} \approx \sqrt{\frac{K_1}{M_1}}$$

Figure 2B:
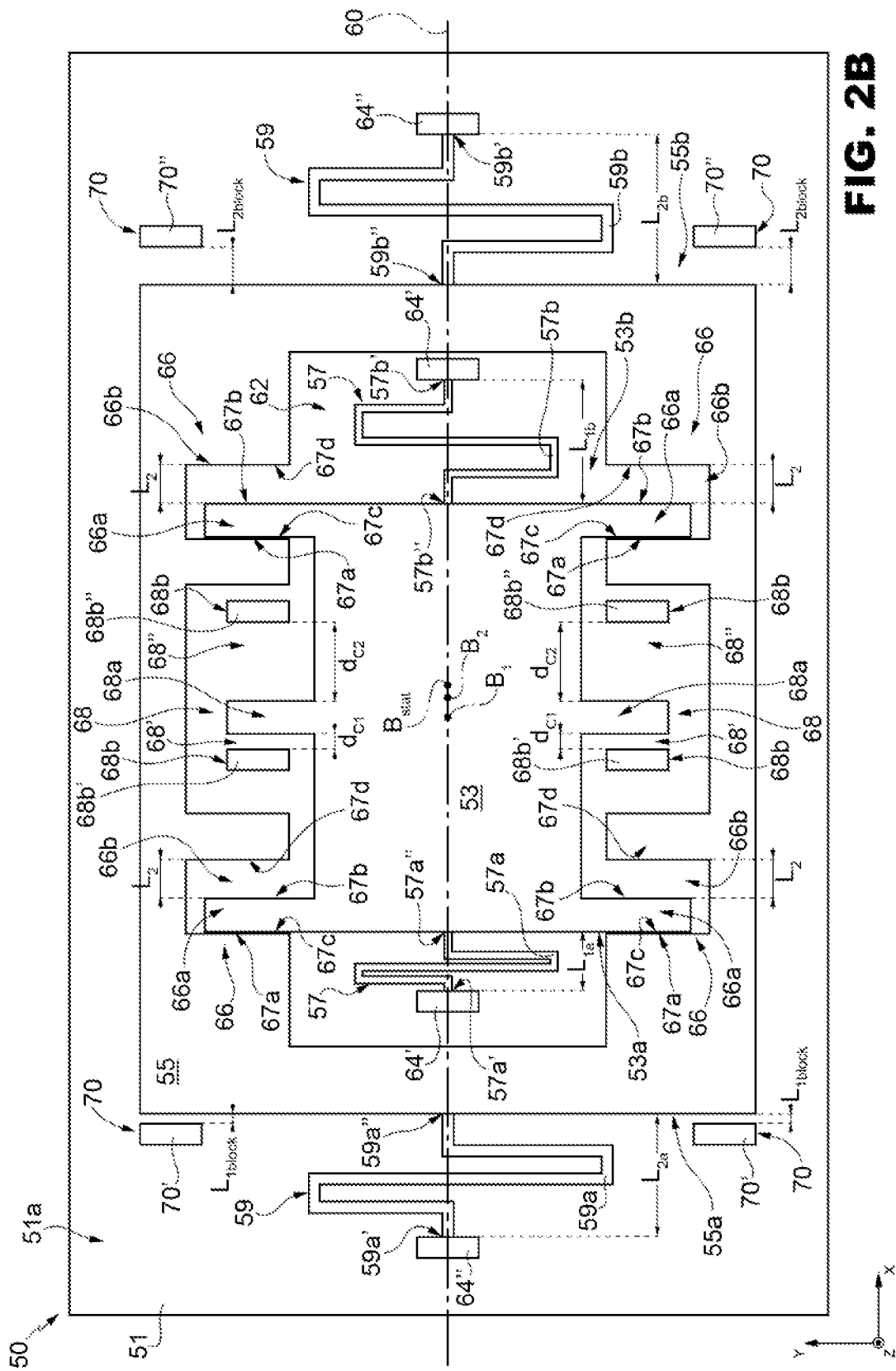

FIG. 2B shows the sensor 50 in a second operating condition, where the external force applied to the sensor 50 has a second force value $F_2$ greater than, or equal to, the threshold value $F_{th}$. For the same reasons as those described previously, the first seismic mass 53 is displaced with respect to the resting position of FIG. 2, and the stopper elements 66a are in abutment against the respective housing elements 66b. In particular, the first centroid $B_1$ is displaced, in the plane XY along the first axis X, with respect to the position $B_{stat}$ (centroid at rest) and the first seismic mass 53 is in direct physical contact with the second seismic mass 55 at the first side walls 67a, 67c of the stopper elements 66a and of the housing elements 66b. In this operating condition, also the second seismic mass 55 is displaced with respect to the semiconductor body 51, and to its resting position illustrated in FIG. 2, under the thrust of the first seismic mass 53. Therefore, also the second centroid $B_2$ is displaced, in the plane XY along the first axis X, with respect to the position at rest $B_{stat}$. Consequently, in the second operating condition, the second seismic mass 55 moves in a way fixed with respect to the first seismic mass 53. In particular:

the first length $L_1$ is zero and the second length $L_2$ is twice the length $L_{stop}$;
the first distance $d_{c1}$ is less than the resting distance $d_{rest}$ (moreover, it is less than the first distance $d_{c1}$ of FIG. 2A), and the second distance $d_{c2}$ is greater than the resting distance $d_{rest}$ (moreover, it is greater than the second distance $d_{c2}$ of FIG. 2A);
the first length $L_{1a}$ is less than the first length at rest $L_{1rest}$ (moreover, it is less than the first length $L_{1a}$ of FIG. 2A), and the second length Lib is greater than the first length at rest $L_{1rest}$ (moreover, it is greater than the second length Lib of FIG. 2A);
the first length $L_{2a}$ is less than the second length at rest $L_{2rest}$ (moreover, it is less than the first length $L_{2a}$ of FIG. 2A), and the second length $L_{2b}$ is greater than the second length at rest $L_{2rest}$ (moreover, it is greater than the second length $L_{2b}$ of FIG. 2A); and
the first distance $L_{1block}$ is less than the maximum distance $L_{blockmax}$, and the second distance $L_{2block}$ is greater than the maximum distance $L_{blockmax}$.

Therefore, considering by way of example N1=1, N2=1, in the second operating condition of FIG. 2B the resonance pulsation (Ores of the sensor 50 is obtained according to the following mathematical expression:

$$\omega_{res} \approx \sqrt{\frac{K_1+K_2}{M_1+M_2}}$$

In particular, if the external force applied to the sensor 50 has a value greater than, or equal to, a maximum force value $F_{max}$ (greater than the threshold force value $F_{th}$), the second seismic mass 55 is in abutment against the first blocking element 70' at a portion of the first lateral surface 55a of the second seismic mass 55. In other words, the first distance $L_{1block}$ is zero, and the second distance $L_{2block}$ is twice the maximum distance $L_{blockmax}$. The blocking elements 70 therefore enable limitation of any possible oscillations of the second seismic mass 55 (and, consequently, also of the first seismic mass 53), preventing them from overstepping a critical amplitude threshold that might cause damage to or failure of the sensor 50.

Figure 3:
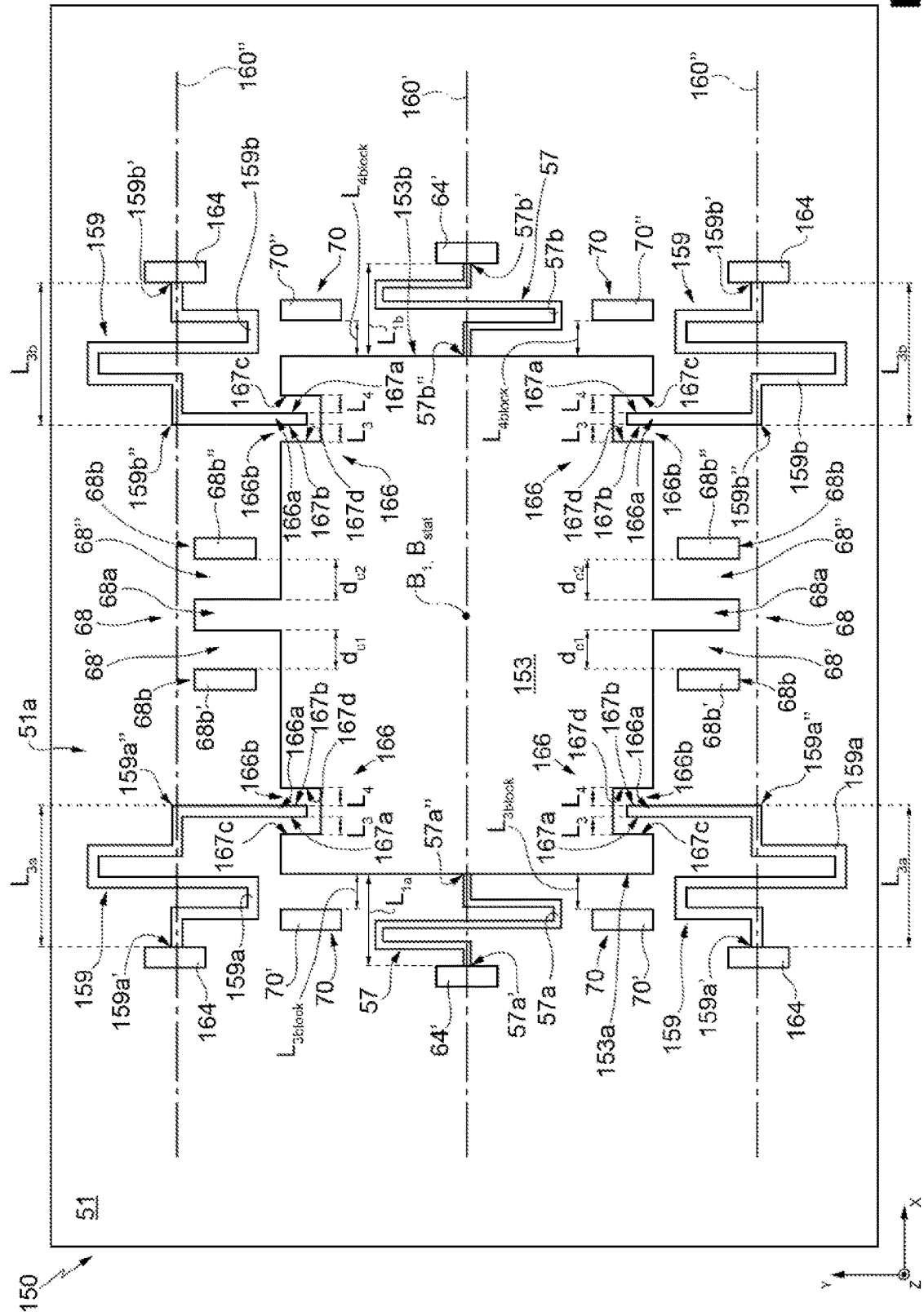
FIG. 3 is a top view of a further embodiment of the micromechanical device according to the present disclosure.

FIG. 3 shows a different embodiment of the sensor (here designated by the reference number 150). The sensor 150 comprises the semiconductor body 51 and a mobile structure 153 (hereinafter referred to as "seismic mass"), having an own mass $M_3$. The seismic mass 153 is, for example, of semiconductor material (such as silicon or polysilicon) and extends parallel to the surface 51a of the semiconductor body 51. The seismic mass 153 has a first lateral surface 153a and a second lateral surface 153b opposite to one another along the first axis X.

The seismic mass 153 is supported by the first spring assembly 57 (described previously with reference to FIG. 2) having a respective axis of deformation extending in a first direction of deformation 160' parallel to the first axis X. In particular, the ends 57a", 57b" of the springs that form the spring assembly 57 are in contact with, and fixed with respect to, the first lateral surface 153a and the second lateral surface 153b, respectively. Consequently, the seismic mass 153 is set, along the first axis X, between the first and second springs 57a, 57b of the spring assembly 57.

In addition, at least one second spring assembly 159 is present. With the sensor 150 in resting conditions, i.e., when the seismic mass 153 is not subject to an external force that causes a displacement thereof, the second spring assembly 159 is physically separate from the seismic mass 153; in a different operating condition of the sensor 150, when an external force acts on the seismic mass 153, causing a displacement thereof in the direction of the axis X, the seismic mass 153 comes into abutment against abutment regions of the second spring assembly 159.

The second spring assembly 159 is, for example, of semiconductor material (such as silicon or polysilicon) and has an elastic constant $K_3$ thereof different from the elastic constant $K_1$ of the first spring assembly 57 (for example, higher than the elastic constant $K_1$). The axis of deformation of the second spring assembly 159 extends parallel to the axis X and is staggered with respect to the axis of deformation of the first spring assembly 57. The second spring assembly 159 includes a first elastic element (spring) 159a and a second elastic element (spring) 159b.

In the embodiment described by way of example, both the first elastic element 159a and the second elastic element 159b are serpentine springs, i.e., strips arranged to form respective paths extending in a serpentine fashion (as described previously). Each elastic element 159a, 159b has a respective end 159a', 159b' coupled to the semiconductor body 51 and a respective end 159a", 159b" coupled to the seismic mass 153. In particular, each elastic element 159a, 159b of the second spring assembly 159 is coupled, via the respective end 159a', 159b', to a respective fixing element 164 coupled to the surface 51a of the semiconductor body 51 (in particular, each fixing element 164 is fixed with respect to the surface of the semiconductor body 51).

In the embodiment of FIG. 3, four elastic elements 159a, 159b are present, so that the equivalent elastic constant of the second spring assembly 159 is given by $4K_3$. In general, for any number N3 of elastic elements of the second spring assembly 159, the equivalent elastic constant of the second spring assembly 159 is given by $N3·K_3$.

Each first elastic element 159a has an extension, measured along the first axis X between the respective ends 159a' and 159a", equal to a first length $L_{3a}$, and each second elastic element 159b has an extension, measured along the first axis X between the respective ends 159b' and 159b", equal to a second length $L_{3b}$.

Each elastic element 159a, 159b of the second spring assembly 159 includes, in a position corresponding to the respective end 159a", 159b", a respective stopper element 166a obtained by a terminal protrusion having a main extension parallel to the second axis Y (i.e., perpendicular to the direction of the oscillations of the seismic mass 153).

The seismic mass 153 has a recess, within which the stopper element 166a extends. Portions of the seismic mass 153 that include said recess form a respective housing element 166b for the stopper element 166a. Each stopper element 166a and the respective housing element 166b form a respective abutment assembly 166.

Each stopper element 166a has a first side wall 167a and a second side wall 167b, opposite to one another along the first axis X, while each housing element 166b has a first side wall 167c and a second side wall 167d, opposite to one another along the first axis X and facing the first and second side walls 167a, 167b, respectively, of the respective stopper element 166a. For each abutment assembly 166, the side walls 167a, 167c are at a distance equal to a first length $L_3$ from one another, whereas the side walls 167b, 167d are at a distance equal to a second length $L_4$ from one another.

Each stopper element 166a operates in a similar way to the stopper element 66a of FIG. 2, whereas the housing element 166b has a function similar to what has been described with reference to the housing element 66b of FIG. 2.

As better described hereinafter, in an operating condition, the seismic mass 153 and each elastic element 159a, 159b abut against one another via each stopper element 166a and the respective housing element 166b.

Furthermore, as has been described with reference to FIG. 2, the first seismic mass 153 includes the first and second electrodes 68a, 68b, thus forming the measurement structure 68 already described with reference to FIG. 2.

In addition, the blocking elements 70 are present, here facing the first and second lateral surfaces 153a, 153b of the seismic mass 153. In particular, at least one (in FIG. 3, two) the first blocking element 70' is at a distance $L_{3block}$ from the first lateral surface 153a, along the first axis X, and at least one (in FIG. 3, two) second blocking element 70" is at a distance $L_{4block}$ from the second lateral surface 153b, along the first axis X. It may be noted that the distance $d_{c1}$ is greater than $L_3+L_{3block}$, and the distance da is greater than $L_4$ $L_{4block}$.

In use, the sensor 150 is biased, as discussed previously, for carrying out measurement of the external force applied.

With the sensor 150 in the resting condition as shown in FIG. 3, no external force is applied to the sensor 150, and therefore the seismic mass 153 is in the resting position. In particular, in the plane XY, the seismic mass 153 has a centroid B (in the resting condition, equal to the centroidal position $B_{stat}$). In addition:
- the lengths $L_3$, $L_4$ are the same as one another and equal to the stop length $L_{stop}$;
- the first and second distances $d_{c1}$, $d_{c2}$ are the same as one another and equal to the distance at rest $d_{rest}$;
- the first length $L_{1a}$ and the second length Lib are the same as one another and equal to the first length at rest $L_{1rest}$;

the first length $L_{3a}$ and the second length $L_{3b}$ are the same as one another and equal to a second length at rest $L_{1rest}$; and the first distance $L_{3block}$ and the second distance $L_{4block}$ are the same as one another and equal to the maximum distance $L_{blockmax}$.

Figure 3A:
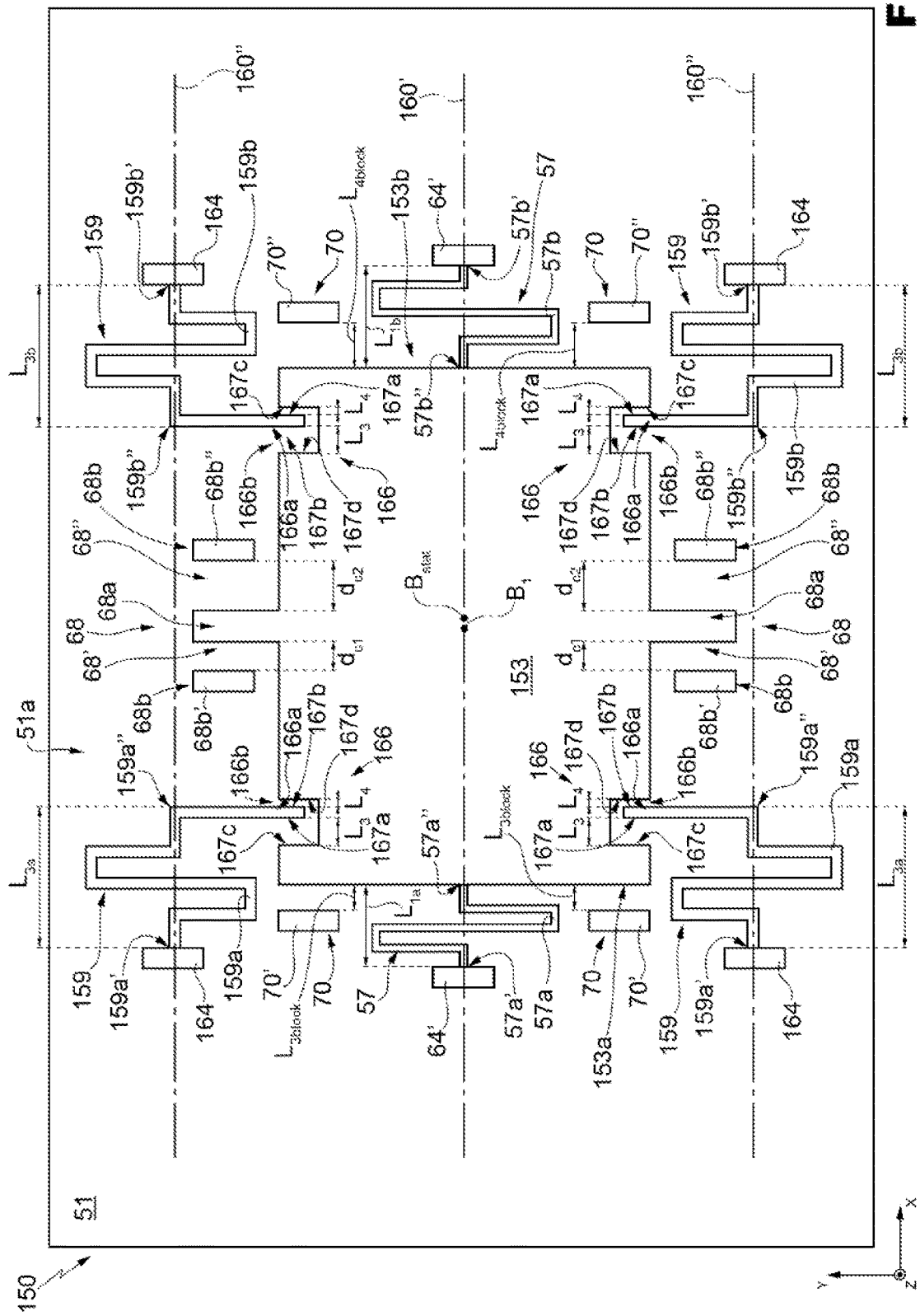
FIGS. 3A and 3B are top views of the micromechanical device of FIG. 3, in respective operating modes.

FIG. 3A shows the sensor 150 in a first operating condition, where the external force (having the first force value $F_1$ less than the threshold force value Far) is applied to the sensor 150. As discussed previously, there is a relative movement of the seismic mass 153 with respect to the semiconductor body 51. In particular, in the plane XY, the centroid B is displaced along the first axis X with respect to the centroid at rest $B_{stat}$. In addition:

the first length $L_1$ is greater than the stop length $L_{stop}$, and the second length $L_2$ is less than the stop length $L_{stop}$;

the first distance da is less than the distance at rest $d_{rest}$, and the second distance da is greater than the distance at rest $d_{rest}$;

the first length $L_{1a}$ is less than the first length at rest $L_{1rest}$, and the second length Lib is greater than the first length at rest $L_{1rest}$;

the first length $L_{3a}$ and the second length $L_{3b}$ are the same as one another and equal to the length at rest $L_{1rest}$; and the first distance $L_{3block}$ is less than the maximum distance $L_{blockmax}$, and the second distance $L_{4block}$ is greater than the maximum distance $L_{blockmax}$.

Therefore, considering by way of example N1=1, N3=1, in the first operating condition of FIG. 3A, the resonance pulsation (ores of the sensor 150 is obtained according to the following mathematical expression:

$$\omega_{res} \approx \sqrt{\frac{K_1}{M_3}}$$

Figure 3B:
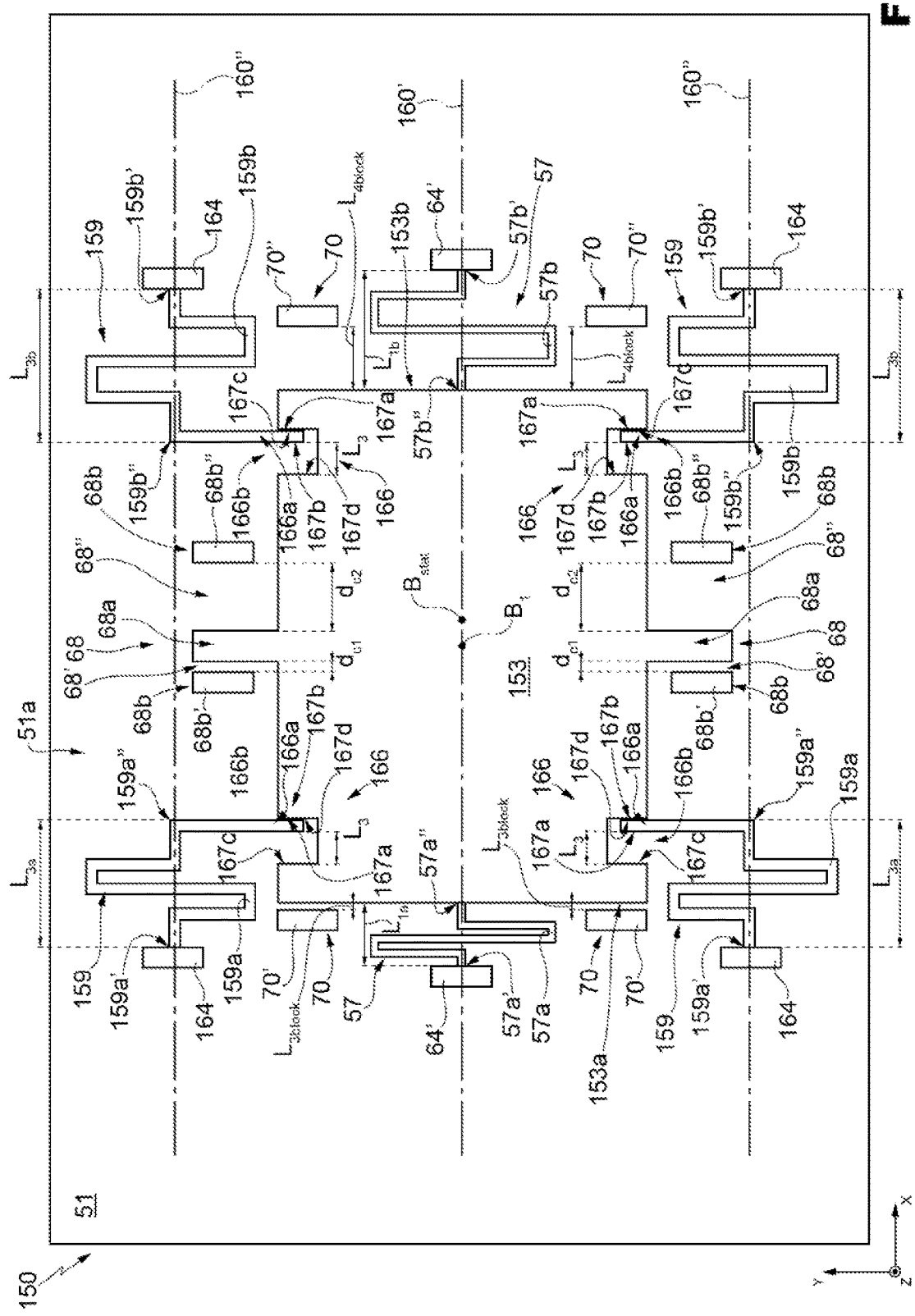

FIG. 3B shows the sensor 150 in a second operating condition, where the external force applied to the sensor 150 has a second force value $F_2$ greater than, or equal to, the threshold value $F_{th}$. For the same reasons as those described previously, the seismic mass 153 is displaced with respect to the resting position of FIG. 3, and each stopper element 166a bears upon the respective housing element 166b (i.e., the seismic mass 153 is in contact with the stopper element 166a of the second spring assembly 159). In particular, in the plane XY the centroid B has a displacement along the first axis X with respect to the position of the centroid at rest $B_{stat}$ greater than in the case illustrated in FIG. 3A, and the seismic mass 153 is in direct physical contact with the second spring assembly 159. In addition:

the first length $L_1$ is twice the length $L_{stop}$, and the second length $L_2$ is zero;

the first distance $d_{c1}$ is less than the distance at rest $d_{rest}$ (moreover, it is less than the first distance $d_{c1}$ of FIG. 3A), and the second distance $d_{c1}$ is greater than the distance at rest $d_{rest}$ (moreover, it is greater than the second distance $d_{c1}$ of FIG. 3A);

the first length $L_{1a}$ is less than the first length at rest $L_{1rest}$ (moreover, it is less than the first length $L_{1a}$ of FIG. 3A), and the second length Lib is greater than the first length at rest $L_{1rest}$ (moreover, it is greater than the second length Lib of FIG. 3A);

the first length $L_{3a}$ is less than the second length at rest $L_{3rest}$, and the second length $L_{3b}$ is greater than the second length at rest $L_{3rest}$; and the first distance $L_{3block}$ is less than the maximum distance $L_{blockmax}$ (moreover, it is less than the first distance $L_{3block}$ of FIG. 3A), and the second distance $L_{4block}$ is greater than the maximum distance $L_{blockmax}$ (moreover, it is greater than the second distance $L_{4block}$ of FIG. 3A).

Therefore, considering by way of example N1=1, N3=1, in the second operating condition of FIG. 3B, the resonance pulsation $\omega_{res}$ of the sensor 150 is obtained according to the following mathematical expression:

$$\omega_{res} \approx \sqrt{\frac{K_1 + K_3}{M_3}}$$

In particular, if the external force applied to the sensor 150 has a value greater than, or equal to, the maximum force value $F_{max}$ (greater than the threshold force value $F_{th}$), the seismic mass 153 bears upon the first blocking element 70' at a portion of the first lateral surface 153a of the seismic mass 153. The blocking elements 70 therefore enable limitation of any possible oscillations of the seismic mass 153, preventing them from overstepping a critical threshold of amplitude that might cause damage to or failure of the sensor 150.

Figure 3C:
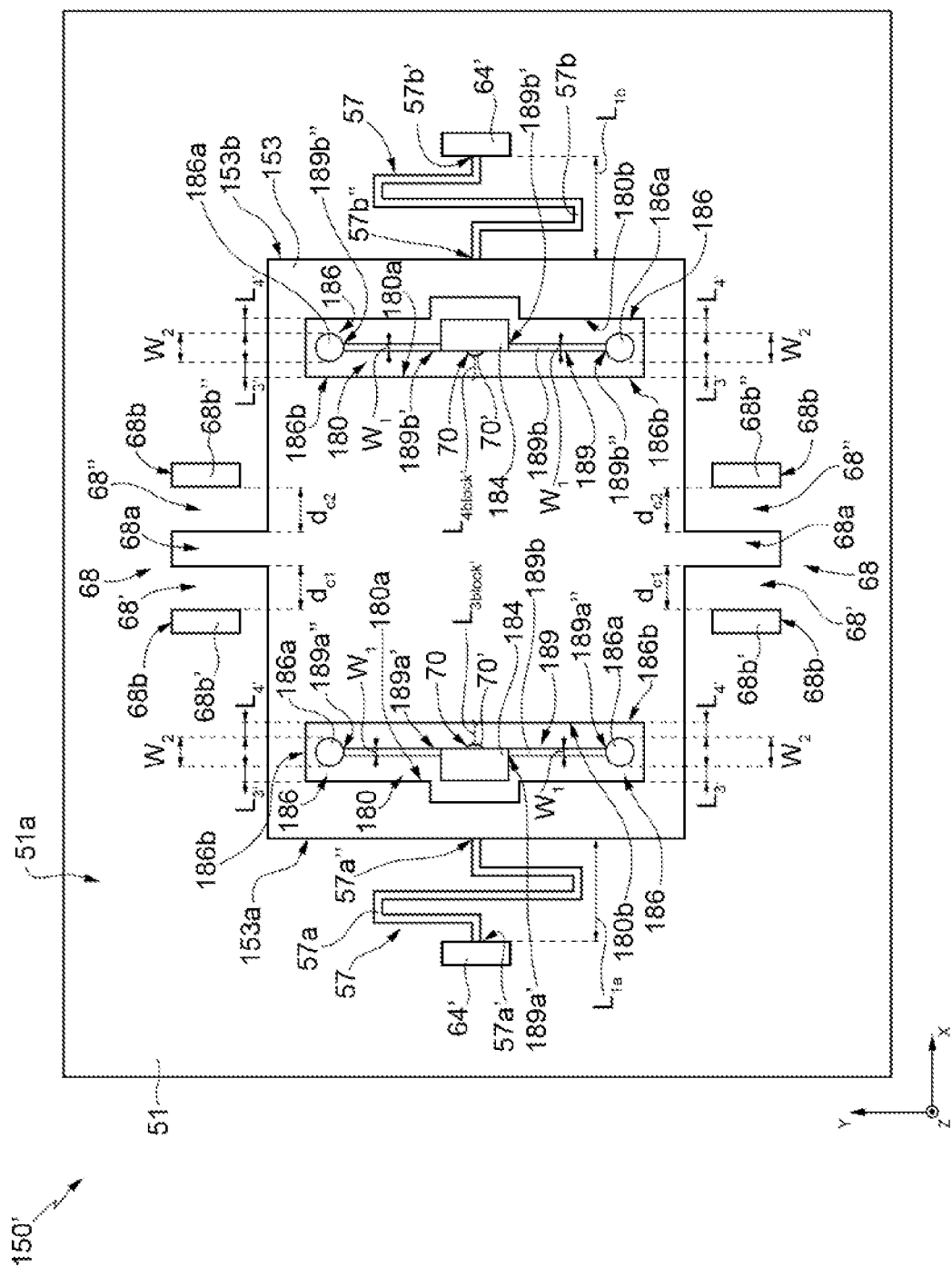
FIG. 3C is a top view of a further embodiment of the micromechanical device according to the present disclosure.

In addition, FIG. 3C shows a further embodiment of the sensor 150 (here designated by the reference 150'), similar to the one illustrated in FIG. 3.

In particular, in FIG. 3C the seismic mass 153 encloses and delimits at least one through opening, or cavity, 180, where a second set 189 of springs extends (which takes the place of the second spring assembly 159 of FIG. 3). In particular, the seismic mass 153 has side walls 180a, 180b opposite to one another along the first axis X and directly facing the cavity 180.

The second set 189 of springs comprises a first spring (elastic element) 189a and a second spring (elastic element) 189b, each having an elastic constant $K_3$, thereof, for example higher than the elastic constant $K_1$ of the first spring assembly 57. With the sensor 150' in the resting condition, i.e., when the seismic mass 153 is not subject to an external force that causes a displacement thereof, the second set 189 of springs is physically separate from the seismic mass 153. In a different operating condition of the sensor 150', when an external force acts on the seismic mass 153, causing a displacement thereof in the direction of the axis X, the seismic mass 153 comes into abutment against the abutment regions 186a of the second spring assembly 159.

Each spring 189a, 189b is a planar spring obtained with MEMS technology, in particular a spring including a strip (for example, of semiconductor material), extending in the plane XY and having a main extension parallel to the second axis Y and a width $W_1$ measured along the first axis X. The first spring 189a develops between an end 189a' thereof and an end 189a" thereof, opposite to one another with respect to the second axis Y, and the second spring 189b develops between an end 189b' thereof and an end 189b" thereof, opposite to one another with respect to the second axis Y. The ends 189a', 189b' are fixed with respect to respective fixing elements 184 coupled to the surface 51a of the semiconductor body 51 (in particular, each fixing element 184 is fixed with respect to the surface of the semiconductor body 51 and extends in the cavity 180). The abutment regions 186a are located at the ends 189a", 189b". In particular, the abutment regions 186a are fixed with respect to the ends 189a", 189b" and have a width $W_2$, measured along the first axis X, greater than the width $W_1$. Alternatively, the abutment regions 186a are portions of the springs 189a, 189b that have a width $W_2$, measured along the first axis X, greater than the width $W_1$.

With the sensor 150' in the operating condition where an external force acts on the seismic mass 153 causing a displacement thereof in the direction of the axis X, one of the side walls 180a, 180b bears upon the abutment regions 186a of the second spring assembly 159, causing a deflection (deformation) of the respective spring 189a, 189b along the first axis X. The lengths, measured along the axis X, between the abutment regions 186a and the side walls 180a, 180b, are here identified by $L_{3'}$, $L_{4'}$ and are homologous to the lengths $L_3$, $L_4$ of FIG. 3.

Each abutment region 186a and the side walls 180a, 180b of the seismic mass 153 facing it therefore form a respective abutment assembly 186, which enables variation of the elastic constant of the sensor 150', as has been described with reference to FIGS. 3-3B.

Furthermore, in the embodiment illustrated in FIG. 3C, the abutment regions 186a have, in the plane XY, a round shape (i.e., a circular profile) in order to distribute better the mechanical stresses due to contact between the abutment regions 186a and the side walls 180a, 180b of the seismic mass 153.

As in FIG. 3, the blocking elements 70 are moreover present. The blocking elements 70 extend (see FIG. 3C) in the cavity 180. They are fixed with respect to the surface 51a of the semiconductor body 51 (in particular, each blocking element 70 is fixed with respect to the respective fixing element 184) and face one of the side walls 180a, 180b of the seismic mass 153, from which they are separated by distances $L_{3block'}$, $L_{4block'}$ homologous to the distances $L_{3block}$, $L_{4block}$ of FIG. 3.

In the embodiment of FIG. 3C, four springs 189a, 189b are present, so that the equivalent elastic constant of the second set 189 of springs is given by $4K_{3'}$. In general, for any number N3' of springs of the second set 189 of springs, the equivalent elastic constant of the second set 189 of springs is given by $N3' \cdot K_{3'}$.

Figure 4:
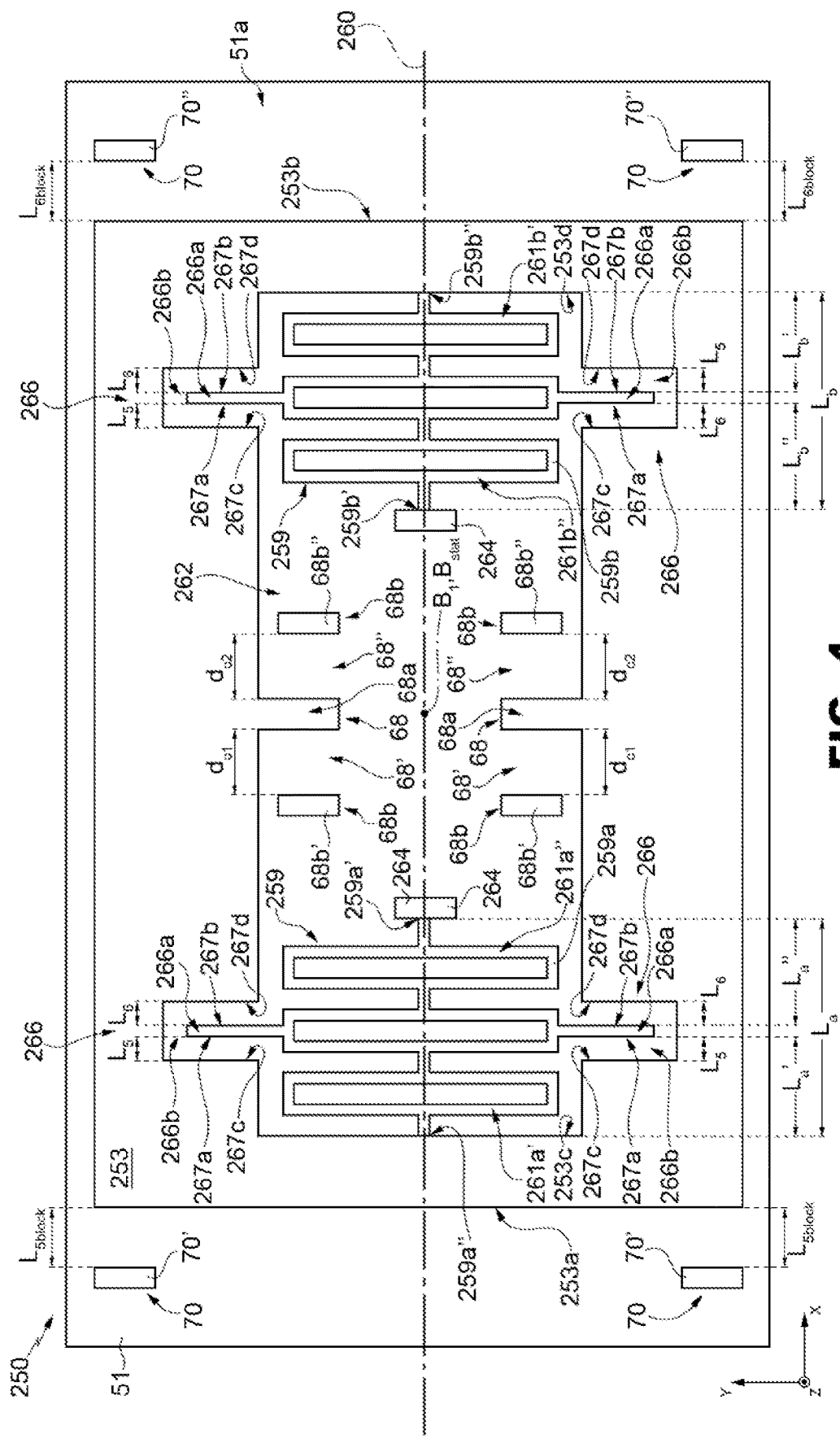
FIG. 4 is a top view of a further embodiment of the micromechanical device according to the present disclosure.

FIG. 4 shows a different embodiment of the sensor (here designated by the reference number 250). The sensor 250 comprises the semiconductor body 51 and a mobile structure (hereinafter referred to as "seismic mass") 253, having a mass $M_4$. The seismic mass 253 is, for example, of semiconductor material (such as silicon or polysilicon) and extends parallel to the surface 51a of the semiconductor body 51. The seismic mass 253 has a through opening, or cavity, 262. The seismic mass 253 surrounds and delimits said cavity 262. The seismic mass 253 is externally delimited by a first lateral surface 253a and a second lateral surface 253b opposite to one another along the first axis X. The seismic mass 253 also has a third lateral surface 253c and a fourth lateral surface 253d, which are opposite to one another along the first axis X and directly face the cavity 262.

The seismic mass 253 is physically coupled to the semiconductor body 51 via at least one spring assembly 259, which extends in the cavity 262. The spring assembly 259 is, for example, of semiconductor material (such as silicon or polysilicon) and has a respective axis of deformation in a direction of deformation 260 parallel to the first axis X. The spring assembly 259 includes a first spring (elastic element) 259a and a second spring (elastic element) 259b. In one embodiment (not illustrated), the springs 259a, 259b are planar springs obtained with MEMS technology, more in particular springs that include a plurality of turns that define a serpentine path (as discussed previously; in particular, the springs 259a, 259b include first and second portions similar to the ones defined previously). In a per se known manner, each turn is defined as the minimum ensemble of first and second portions of each spring 259a, 259b (having a turn length, not illustrated, measured along the first axis X), which, when replicated a number of times by translating it by the turn length in the direction of deformation 260, forms said spring 259a, 259b. In the embodiment of FIG. 4, the springs 259a, 259b are planar springs obtained with MEMS technology, more in particular springs that include a plurality of turns. Each turn extends in the plane XY and includes a strip, for example, of semiconductor material, arranged to form a polygonal closed path (for example, a rectangular path comprising minor sides parallel to the first axis X and major sides parallel to the second axis Y).

The number of turns is equal to a total number of turns $n_{foldtot}$.

Both the first spring 259a and the second spring 259b of the spring assembly 259 have a respective end 259a' and a respective end 259b'', opposite to one another along the first axis X. Each spring 259a, 259b is coupled, via the respective end 259a', 259b', to a respective fixing element 264 fixed with respect to the semiconductor body 51 (in particular, with respect to the surface 51a of the semiconductor body 51). Each spring 259a, 259b of the second spring assembly 59 is moreover coupled, via the respective end 259a'', 259b'', to the seismic mass 253. In detail, the ends 259a'', 259b'' coupled to the seismic mass are in contact with the third lateral surface 253c and the fourth lateral surface 253d, respectively, of the seismic mass 253.

The first spring 259a has an extension, measured along the first axis X between the end 259a' and the end 259a'', equal to a first length $L_a$. The second spring 259b has an extension, measured along the first axis X between the end 259b' and the end 259b'' equal to a first length $L_b$. Moreover, each spring 259a, 259b includes at least one stopper element 266a arranged so as to come into abutment against the seismic mass 253 in an operating condition of the sensor 250, as discussed more fully hereinafter. Said stopper element 266a is a protrusion of each portion 259a, 259b, having a main extension parallel to the second axis Y, and extends within a recess of the seismic mass 253. In what follows the portion of the seismic mass 253 that includes said recess is referred to as housing element 266b. The stopper element 266a and the housing element 266b form an abutment assembly 266.

Each stopper element 266a has a first side wall 267a and a second side wall 267b, opposite to one another along the first axis X, while each housing element 266b has a first side wall 267c and a second side wall 267d, which are opposite to one another along the first axis X and face the first side wall 267a and the second side wall 267b, respectively, of the respective stopper element 266a. For each abutment assembly 266, the side walls 267a, 267c are at a distance equal to a first length $L_5$ from one another, while the side walls 267b, 267d are at a distance equal to a second length $L_6$ from one another.

For the spring 259a of the spring assembly 259 there are identified a first region 261a', which includes the turns comprised between the end 259a'' and the stopper element 266a, and a second region 261a'', which includes the turns comprised between the end 259a' and the stopper element 266a. For the spring 259b of the spring assembly 259 there are identified a first region 261b', which includes the turns comprised between the end 259b'' and the stopper element 266a, and a second region 261b″, which includes the turns comprised between the end 259b′ and the stopper element 266a.

The length, measured along the axis X between the end 259a″ and the stopper element 266a is here identified by $L_{a''}$. It may be noted that, since in this example the stopper element 266a has a rectangular shape, the length $L_{a'}$ is defined between the end 259a″ and an axis passing through the centroid of the stopper element 266a and lying parallel to the axis Y. The length, measured along the axis X between the end 259a′ and the stopper element 266a is here identified by $L_{a''}$. Likewise, the length $L_{a''}$ is defined between the end 259a′ and the aforementioned axis passing through the centroid of the stopper element 266a and lying parallel to the axis Y. The length, measured along the axis X between the end 259b″ and the stopper element 266a is here identified by $L_{b'}$. Likewise, the length $L_{b'}$ is defined between the end 259b″ and the aforementioned axis passing through the centroid of the stopper element 266a and lying parallel to the axis Y. The length, measured along the axis X, between the end 259b′ and the stopper element 266a is here identified by $L_{b''}$. Likewise, the length $L_{b''}$ is defined between the end 259b′ and the aforementioned axis passing through the centroid of the stopper element 266a and lying parallel to the axis Y.

For the spring 259a, the sum of the length $L_{a'}$ and of the length $L_{a''}$ is therefore equal to the first length $L_a$. For the spring 259b, the sum of the length $L_{b'}$ and of the length $L_{b''}$ is therefore equal to the second length $L_b$. In the embodiment described by way of example, for each portion 259a, 259b the lengths $L_{a'}$, $L_{a''}$, $L_{b'}$, and $L_{b''}$ are the same as one another in the resting condition of the sensor 250, and the number of turns present between the ends 259a″, 259b″ and the stopper element 266a is equal to the number of turns present between the stopper element 266a and the ends 259a′, 259b′. However, according to further embodiments, not illustrated, the lengths $L_{a'}$ and $L_{a''}$ may be, in the resting condition of the sensor 250, different from one another, and the number of turns present between the end 259a″ and the stopper element 266a may be different from the number of turns present between the stopper element 266a and the end 259a′. Likewise, the lengths $L_{b'}$ and $L_{b''}$ may be, in the resting condition of the sensor 250, different from one another, and the number of turns present between the end 259b″ and the stopper element 266a may be different from the number of turns present between the stopper element 266a and the end 259b′.

In addition, as has been described with reference to FIG. 2, the seismic mass 253 includes the first and second electrodes 68a, 68b, which form the measurement structure 68.

Furthermore, the blocking elements 70 are present, facing the first and second lateral surfaces 253a, 253b of the seismic mass 253. In particular, at least one (in FIG. 4, two) first blocking element 70′ is at a distance $L_{5block}$, along the first axis X, from the first lateral surface 253a of the seismic mass 253, and at least one (in FIG. 4, two) second blocking element 70″ is at a distance $L_{6block}$, along the first axis X, from the second lateral surface 253b of the seismic mass 253.

In use, the sensor 250 is biased, as discussed previously, for carrying out measurement of the external applied force.

With the sensor 250 in the resting condition as shown in FIG. 4, no external force is applied to the sensor 250, and therefore the seismic mass 253 is in the resting position. In particular, in the plane XY, the seismic mass 253 has a centroid B that coincides, in the resting condition, with a position $B_{star}$. In addition:

the first and second lengths $L_5$, $L_6$ are the same as one another and equal to the stop length $L_{stop}$;

the first and second distances $d_{c1}$, $d_{c2}$ are the same as one another and equal to the distance at rest $d_{rest}$;

the first length $L_a$ and the second length $L_b$ are the same as one another and equal to a length at rest $L_{rest}$; and the first distance $L_{5block}$ and the second distance $L_{6block}$ are the same as one another and equal to the maximum distance $L_{blockmax}$.

FIG. 4A shows the sensor 250 in a first operating condition, where the external force (having the first force value $F_1$ lower than the threshold force value $F_{th}$) is applied to the sensor 250. As discussed previously, there is a relative movement of the seismic mass 253 with respect to the semiconductor body 51, which causes a deformation of the spring assembly 259. In particular, in the plane XY, the centroid B is displaced along the first axis X with respect to the centroid at rest $B_{star}$. In addition:

the first length $L_5$ is greater than the stop length $L_{stop}$, and the second length $L_6$ is less than the stop length $L_{stop}$;

the first distance $d_{c1}$ is less than the distance at rest $d_{rest}$, and the second distance $d_{c1}$ is greater than the distance at rest $d_{rest}$;

the first length $L_a$ is greater than the length at rest $L_{rest}$, and the second length $L_b$ is less than the length at rest $L_{rest}$; and the first distance $L_{5block}$ is less than the maximum distance $L_{blockmax}$, and the second distance $L_{6block}$ is greater than the maximum distance $L_{blockmax}$.

In detail, since the stopper elements 266a are not yet in direct physical contact with (i.e., they do not abut against) the respective housing elements 266b, the stress is distributed over the entire spring assembly 259, and all the turns undergo deformation. In this operating condition, for each portion 259a, 259b the number of turns that undergo deformation is equal to $n_{fold1}$, which is in turn equal to the total number of turns $n_{foldtot}$ ($n_{fold1}=n_{foldtot}$).

As is in itself known, the elastic constant of a spring, having an axis of deformation, is dependent upon the number of turns of the spring and upon the length of the spring measured along the axis of deformation (in particular, it is inversely proportional both to the number of turns and to said length). Consequently, each spring 259a, 259b of the spring assembly 259 has, in the first operating condition, a first elastic constant $K_4$ depending upon the number $n_{fold1}$ of turns effectively involved in deformation. In the embodiment of FIG. 4, two springs 259a, 259b are present, so that the equivalent elastic constant of the spring assembly 259 in the first condition is given by $2K_4$. In general, for any number N4 of springs of the spring assembly 259, the equivalent elastic constant of the spring assembly 259 in the first operating condition is given by $N4 \cdot K_4$.

Therefore, considering by way of example N4=1, in the first operating condition of FIG. 4A, the resonance pulsation $\omega_{res}$ of the sensor 250 is obtained by applying the following mathematical expression:

$$\omega_{res} \approx \sqrt{\frac{K_4}{M_4}}$$

Figure 4B:
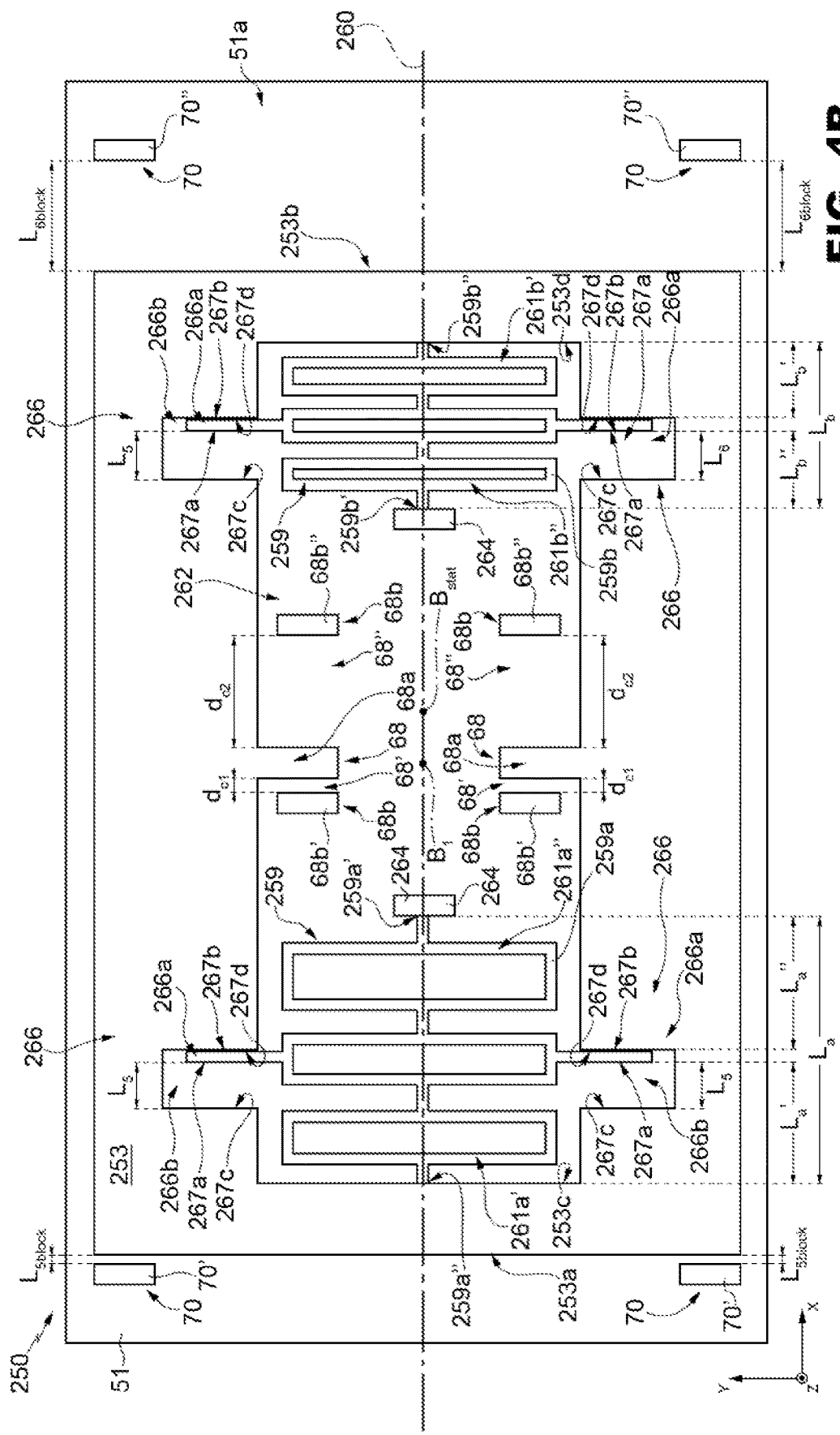

FIG. 4B shows the sensor 250 in a second operating condition, where the external force applied to the sensor 250 has a second force value $F_2$ greater than, or equal to, the threshold force value fib. For the same reasons as those described previously, the seismic mass 253 is displaced with respect to the resting position of FIG. 4, and the stopper elements 266a are in abutment against the respective housing elements 266b. In particular, in the plane XY, the centroid B presents a displacement along the first axis X with respect to the centroid at rest $B_{stat}$ greater than in the case illustrated in FIG. 4A, and the springs 259a, 259b of the spring assembly 259 are set in direct physical contact with the seismic mass 253. In addition:

- the first length $L_5$ is twice the stop length $L_{stop}$, and the second length $L_6$ is zero;
- the first distance $d_{c1}$ is less than the distance at rest $d_{rest}$ (moreover, it is less than the first distance $d_{c1}$ of FIG. 4A), and the second distance $d_{c2}$ is greater than the distance at rest $d_{rest}$ (moreover, it is greater than the second distance $d_{c2}$ of FIG. 4A);
- the first length $L_a$ is greater than the length at rest $L_{rest}$ (moreover, it is greater than the first length $L_a$ of FIG. 4A), and the second length $L_b$ is less than the length at rest $L_{rest}$ (moreover, it is less than the second length $L_b$ of FIG. 4A); and
- the first distance $L_{5block}$ is less than the maximum distance $L_{blockmax}$ (moreover, it is less than the first distance $L_{5block}$ of FIG. 4A), and the second distance $L_{6block}$ is greater than the maximum distance $L_{blockmax}$ (moreover, it is greater than the second distance $L_{6block}$ of FIG. 4A).

In detail, since the stopper elements 266a are in direct physical contact with (i.e., in abutment against) the respective housing elements 266b, the further stress (i.e., the difference between the stress applied and the minimum stress necessary for bringing the stopper elements 266a into abutment against the respective housing elements 266b) is distributed only over the turns of the second regions 261a", 261b" of the springs 259a and 259b, which undergo further deformation: in other words, these are the turns comprised between the stopper element 266a and the end 259a' (respectively, 259b'). In what follows, denoted by the reference $n_{fold2}$ is the number of turns belonging to each second region 261a", 261b" of the springs 259a and 259b.

In the embodiment provided by way of example presented in FIG. 4, we have $n_{fold2}=n_{foldtot}/2$. Consequently, each spring 259a, 259b of the spring assembly 259 has, in the second operating condition, a second elastic constant $K_5$ that depends upon the second number of turns $n_{fold2}$ (the second elastic constant $K_5$ being higher than the first elastic constant $K_4$). In the embodiment of FIG. 4, two springs 259a, 259b are present, so that the equivalent elastic constant of the spring assembly 259 in the second operating condition is given by $2K_5$. In general, given any number N4 of springs of the spring assembly 259, the equivalent elastic constant of the spring assembly 259 in the second operating condition is given by $N4 \cdot K_5$.

Therefore, considering by way of example N4=1, in the second operating condition of FIG. 4B, the resonance pulsation $\omega_{res}$ of the sensor 250 is obtained according to the following mathematical expression:

$$\omega_{res} \approx \sqrt{\frac{K_5}{M_4}}$$

In particular, if the external force applied to the sensor 250 has a value greater than, or equal to, the maximum force value $F_{max}$ (greater than the threshold force value $F_{th}$), the seismic mass 253 bears upon the first blocking element 70'.

Figure 5:
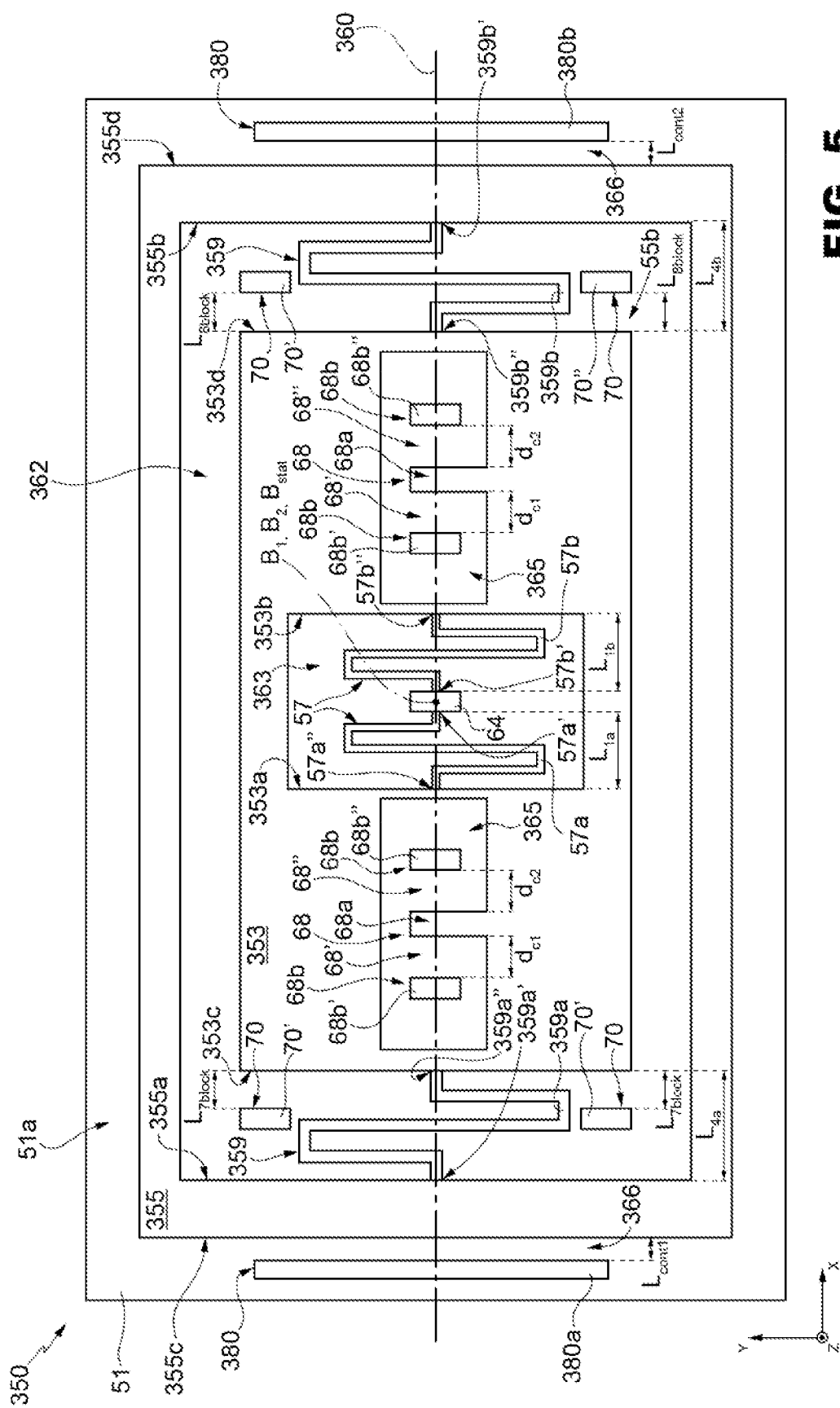
FIG. 5 is a top view of a further embodiment of the micromechanical device according to the present disclosure.

FIG. 5 shows a further embodiment of a micromechanical device 350 (referred to hereinafter as "sensor 350") according to one aspect of the present disclosure. The sensor 350 comprises the semiconductor body 51, a first mobile structure (hereinafter "seismic mass") 353 having a first mass $M_5$, and a second mobile structure (hereinafter "seismic mass") 355 having a second mass $M_6$, for example greater than the first mass $M_5$. Both the first and second seismic masses 353, 355 are, for example, of semiconductor material (such as silicon or polysilicon) and extend parallel to the surface 51a of the semiconductor body 51. The second seismic mass 355 encloses and delimits a first through opening, or cavity, 362. Moreover, the second seismic mass 355 includes: a first side wall 355a and a second side wall 355b, directly facing the first cavity 362 and opposite to one another along the first axis X; and a third side wall 355c and a fourth side wall 355d, opposite to one another along the first axis X, which delimit the second seismic mass 355 externally.

The first seismic mass 353 is completely contained within the cavity 362. The first seismic mass 353 has, in turn, a second through opening, or cavity 363. The first seismic mass 353 encloses and delimits the cavity 363. Moreover, the first seismic mass 353 includes: a first side wall 353a and a second side wall 353b, directly facing the cavity 363 and opposite to one another along the first axis X; and a third side wall 353c and a fourth side wall 353d, facing the first cavity 362 and opposite to one another along the first axis X. The first seismic mass 353 is physically coupled to the semiconductor body 51 via a first set of springs (similar to what has been described with reference to the first spring assembly 57 of FIG. 2, and therefore designated in what follows as first spring assembly 57) completely contained in the second cavity 363. In particular, the fixing ends 57a', 57b' of both of the springs 57a, 57b are fixed with respect to a same fixing element 64 (which in turn extends in the second cavity 363, in a way fixed with respect to the semiconductor body 51, in particular to the surface 51a of the semiconductor body 51). The ends 57a", 57b" of the springs 57a, 57b of the first spring assembly 57 are, instead, fixed with respect to the first side wall 353a and the second side wall 353b, respectively, of the first seismic mass 353.

The first and second seismic masses 353, 355 are physically coupled to one another via a second spring assembly 359 (e.g., to the spring assembly 59 of FIG. 2), which extends in the first cavity 362. In particular, the second spring assembly 359 comprises a first spring (elastic element) 359a and a second spring (elastic element) 359b. Each spring 359a, 359b is a planar spring obtained with MEMS technology, more in particular a spring having a plurality of turns that define a serpentine path.

The first spring 359a develops between an end 359a' thereof and an end 359a" thereof, while the second spring 359b develops between an end 359b' thereof and an end 359b" thereof. The ends 359a', 359b' are fixed with respect to the first side wall 355a and second side wall 355b, respectively, of the second seismic mass 355.

The spring 359a has a length, measured along the axis X, between the ends 359a' and 359a", identified by the reference $L_{4a}$; the spring 359b has a length, measured along the axis X, between the ends 359b' and 359b", identified by the reference $L_{4b}$.

The ends 359a", 359b" are, instead, fixed with respect to the third side wall 353c and fourth side wall 353d, respectively, of the first seismic mass 353.

Each spring 359a and 359b has an elastic constant $K_6$ that is higher than the elastic constant $K_1$ of each portion 57a, 57b. In the embodiment of FIG. 5, two springs 359a, 359b are present, so that the equivalent elastic constant of the second spring assembly 259 is equal to $2K_6$. In general, given any number N5 of springs of the second spring assembly 359, the equivalent elastic constant of the second spring assembly 359 is given by $N5 \cdot K_6$. Likewise, in the embodiment of FIG. 5, two springs 57a, 57b are present, so that the equivalent elastic constant of the first spring assembly 57 is equal to $2K_1$. In general, given any number N1 of springs of the first spring assembly 57, the equivalent elastic constant of the first spring assembly 57 is given by $N1 \cdot K_1$.

In addition, the first seismic mass 353 includes at least one third through opening, or cavity, 365. The first seismic mass 353 encloses and delimits the cavity 365. A measurement structure extends in the cavity 365. Said measurement structure is similar to the measurement structure 68 described with reference to FIG. 2, and is therefore designated in what follows by the same reference number. In particular, the first seismic mass 353 includes at least one first electrode 68a, which extends in the third cavity 365 and faces, and is set (along the first axis X) between, a first portion 68b' and a second portion 68b" of the measurement structure 68.

Furthermore, at least one first contact element 380a and at least one second contact element 380b are fixed with respect to the surface 51a of the semiconductor body 51 and face the third side wall 355c and the fourth side wall 355d, respectively, of the second seismic mass 355. The first contact element 380a is at a distance from the third side wall 355c of the second seismic mass 355 equal to a first contact length $L_{cont1}$, and the second contact element 380b is at a distance from the fourth side wall 355d of the second seismic mass 355 equal to a second contact length Lone. The contact lengths $L_{cont1}$, Lone are less than the value of distance at rest $d_{rest}$ ($d_{rest}$ is the distance at rest between the electrode 68a and the electrode 68b', which is equal to the distance at rest between the electrode 68a and the electrode 68b"). Consequently, the second seismic mass 355 is set, along the first axis X, between the first and second contact elements 380a, 380b so that the first and second seismic masses 353, 355 can move with respect to the semiconductor body 51 in a direction of deformation 360 parallel to the first axis X.

Moreover, the blocking elements 70 are present, here facing the third and fourth side walls 353c, 353d of the first seismic mass 353. In particular, at least one (in FIG. 5, two) first blocking element 70' is at a first distance $L_{7block}$ from the third side wall 353c of the first seismic mass 353, along the first axis X, and at least one (in FIG. 5, two) second blocking element 70" is at a second distance $L_{8block}$ from the fourth side wall 353d of the first seismic mass 353, along the first axis X. The first capacitor distance $d_{c1}$ is greater than $L_{7block}$, and the second capacitor distance da is greater than $L_{8block}$.

In use, the sensor 350 is biased, as discussed previously, for carrying out measurement of the external force applied.

With the sensor 350 in the resting condition as shown in FIG. 5, no external force is applied to the sensor 350, and therefore both the first and second seismic masses 353, 355 are stationary and in the resting position. In particular, the first seismic mass 353 has a first centroid $B_1$, and the second seismic mass 355 has a second centroid $B_2$. In the resting condition, in the plane XY, the first and second centroids $B_1$, $B_2$ coincide with one another and with a position at rest $B_{stat}$. In addition:

the first and second contact lengths Leona, Leone are the same as one another and equal to a length at rest $L_{contrest}$;

the first and second distances $d_{c1}$, $d_{c2}$ are the same as one another and equal to the distance at rest $d_{rest}$;

the first length $L_{1a}$ and the second length Lib are the same as one another and equal to the length at rest $L_{1rest}$;

the first length $L_{4a}$ and the second length $L_{4b}$ are the same as one another and equal to a length at rest $L_{1rest}$; and the first distance $L_{7block}$ and the second distance $L_{8block}$ are the same as one another and equal to the maximum distance $L_{blockmax}$.

Figure 5A:
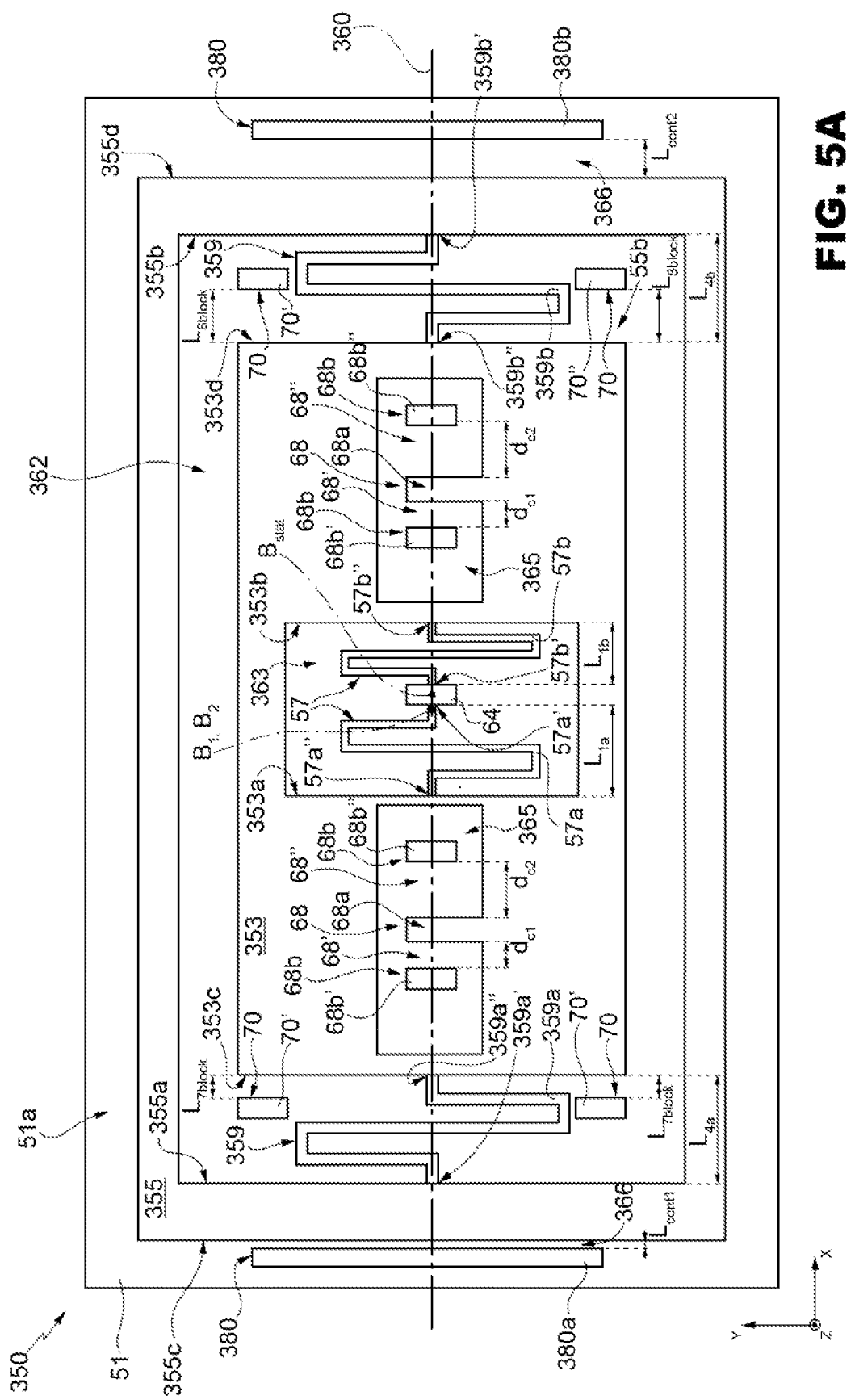
FIGS. 5A and 5B are top views of the micromechanical device of FIG. 5, in respective operating modes.

FIG. 5A shows the sensor 350 in a first operating condition, where the external force (having the first force value $F_1$ lower than a threshold force value Fat) is applied to the sensor 350. In a way similar to what has been discussed previously, there is a relative movement of the first and second seismic masses 253, 255 with respect to the semiconductor body 51. In particular, considering the greater stiffness of the second spring assembly 359 as compared to the stiffness of the first spring assembly 57, the first and second seismic masses 353, 355 move in a way fixed with respect to one another. In detail, both the first centroid $B_1$ and the second centroid $B_2$ are displaced, in the plane XY along the first axis X, with respect to the position of the centroid at rest $B_{stat}$ and substantially coincide with one another. In addition:

the first contact length Leona is less than the length at rest $L_{contrest}$, and the second contact length Leone is greater than the length at rest $L_{contrest}$;

the first distance $d_{c1}$ is less than the distance at rest $d_{rest}$, and the second distance $d_{c2}$ is greater than the distance at rest $d_{rest}$;

the first length $L_{1a}$ is greater than the first length at rest $L_{7rest}$, and the second length $L_{1b}$ is less than the length at rest $L_{7rest}$;

the length $L_{4a}$ and the length $L_{4b}$ are substantially the same as one another and substantially equal to the length at rest $L_{8rest}$; and the first distance $L_{7block}$ is less than the maximum distance $L_{blockmax}$, and the second distance $L_{8block}$ is greater than the maximum distance $L_{blockmax}$.

Therefore, considering by way of example N1=1 and N5=1, in the first operating condition of FIG. 5A, the sensor 350 has a resonance pulsation $\omega_{res}$ according to the following mathematical expression:

$$\omega_{res} \approx \sqrt{\frac{K_1}{M_5 + M_6}}$$

Figure 5B:
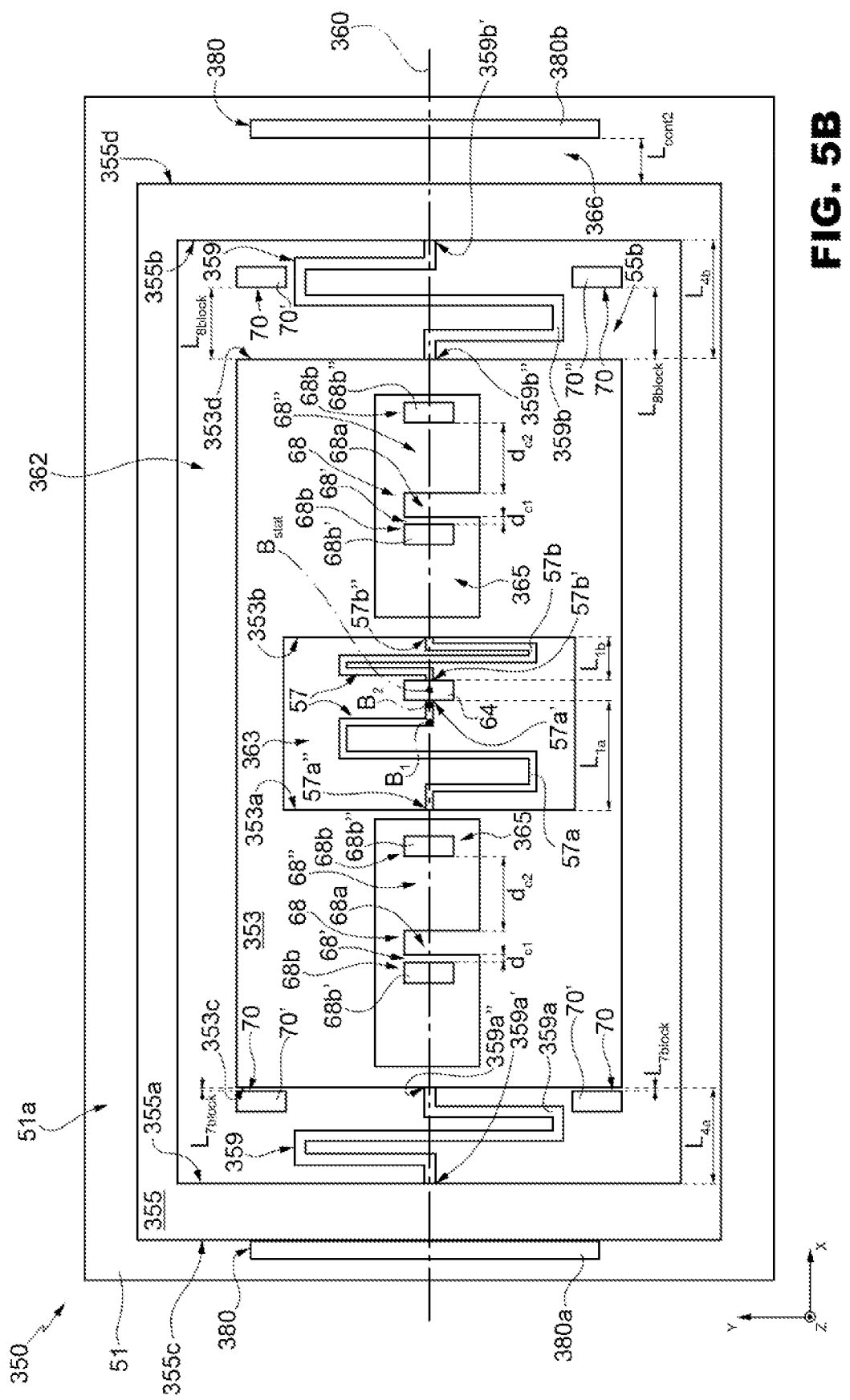

FIG. 5B shows the sensor 350 in a second operating condition, where the external force applied to the sensor 350 has the second force value $F_2$ greater than, or equal to, the threshold force value $F_{th}$. For the same reasons as those described previously, both the first and second seismic masses 353, 355 are displaced with respect to the resting position of FIG. 5, and the second seismic mass 355 bears upon the first contact element 380a at the third side wall 355c of the second seismic mass 355. In particular, in the plane XY, both the first centroid $B_1$ and the second centroid $B_2$ present respective displacements along the first axis X with respect to the position at rest $B_{stat}$ of the centroid greater than the displacements in the case illustrated in FIG. 5A, and the displacement of the first centroid $B_1$ with respect to the position at rest $B_{stat}$ of the centroid is greater than that of the second centroid $B_2$ with respect to the position at rest $B_{stat}$ of the centroid. Consequently, in the second operating condition, the second seismic mass 355 is fixed with respect to the semiconductor body 51, whereas the first seismic mass 353 can oscillate and move further. In addition:

the first contact length $L_{cont1}$ is zero, and the second contact length $L_{cont2}$ is twice the length at rest $L_{contrest}$;

the first distance $d_{c1}$ is less than the distance at rest $d_{rest}$ (moreover, it is less than the distance $d_{c1}$ of FIG. 5A), and the second distance $d_{c2}$ is greater than the distance at rest $d_{rest}$ (moreover, it is greater than the distance $d_{c2}$ of FIG. 5A);

the first length $L_{1a}$ is greater than the first length at rest $L_{1rest}$ (moreover, it is greater than the length $L_{1a}$ of FIG. 5A), and the second length Lib is less than the first length at rest $L_{1rest}$ (moreover, it is less than the length Lib of FIG. 5A);

the first length $L_{4a}$ of the second spring assembly 359 is less than the second length at rest $L_{2rest}$, and the second length $L_{4b}$ is greater than the second length at rest $L_{2rest}$; and the first distance $L_{7block}$ is less than the maximum distance $L_{blockmax}$ (moreover, it is less than the first distance $L_{7block}$ of FIG. 5A), and the second distance $L_{8block}$ is greater than the maximum distance $L_{blockmax}$ (moreover, it is greater than the distance $L_{8block}$ of FIG. 5A).

Therefore, considering by way of example N1=1 and N5=1, in the second operating condition of FIG. 5B, the resonance pulsation $\omega_{res}$ of the sensor 350 is obtained according to the following mathematical expression:

$$\omega_{res} \approx \sqrt{\frac{K_1 + K_6}{M_5}}$$

The contact elements 380 therefore enable limitation of any possible oscillations of the second seismic mass 355 and cause deformation of the second spring assembly 359 thanks to the inertia of the first seismic mass 353 (which, in the second operating mode, is no longer fixed with respect to the second seismic mass 355), thus providing a threshold mechanism for modifying the elastic response of the sensor 350.

Furthermore, if the external force applied to the sensor 350 has a value greater than, or equal to, the maximum force value $F_{max}$ (greater than the threshold force value $F_{th}$), the first seismic mass 353 bears upon the first blocking element 70' at a portion of the third side wall 353c of the first seismic mass 353. In other words, the first distance $L_{7block}$ is zero, and the second distance $L_{8block}$ is twice the maximum distance $L_{blockmax}$. The blocking elements 70 therefore enable limitation of any possible oscillations of the first seismic mass 353, preventing them from overstepping a critical threshold of amplitude that might cause damage to or failure of the sensor 350.

From an examination of the characteristics of the disclosure provided according to the present disclosure, the advantages that it affords are evident.

In particular, the present disclosure makes it possible to provide acceleration sensors that present a variable and/or nonlinear response to accelerations/decelerations. This enables just one sensor to measure different ranges of accelerations/decelerations and therefore detect and discriminate events that are very different from one another. In detail, having a same sensor that measures both accelerations of a low value (for example, equal to 16 g or 32 g) and accelerations of a high value (for example, equal to 128 g) guarantees a saving in terms of power dissipated for its operation, of area of integration dedicated thereto, and of overall cost of the device that houses the sensor.

In greater detail, the sensor 50 has two seismic masses 53, 55 and two spring assemblies 57, 59. It is possible to measure low accelerations via the first seismic mass 53 that deforms the first spring assembly 57 (while the second seismic mass 55 is fixed with respect to the semiconductor body 51, and the second spring assembly 59 does not substantially undergo deformation). It is then possible to measure high accelerations when the seismic masses 53, 55 are in abutment against and are fixed with respect to one another, and contribute to causing deformation both of the first set 57 and of the second spring assembly 59. Moreover, the spring assemblies 57, 59 are not in direct physical contact with one another, and this improves the mechanical stability of the sensor 50 by reducing the stresses to which the spring assemblies 57, 59 are subjected in the event of shocks. In the sensor 50, the threshold mechanism that enables modification of the elastic response of the sensor 50 is given by the elements 66a and 66b. The physical contact that can, in use, occur between the elements 66a and 66b involves elements of a bulk type, which are able to withstand high stresses. Therefore, critical stresses are not reached, thus guaranteeing a better mechanical stability of the sensor 50.

Figure 6A:
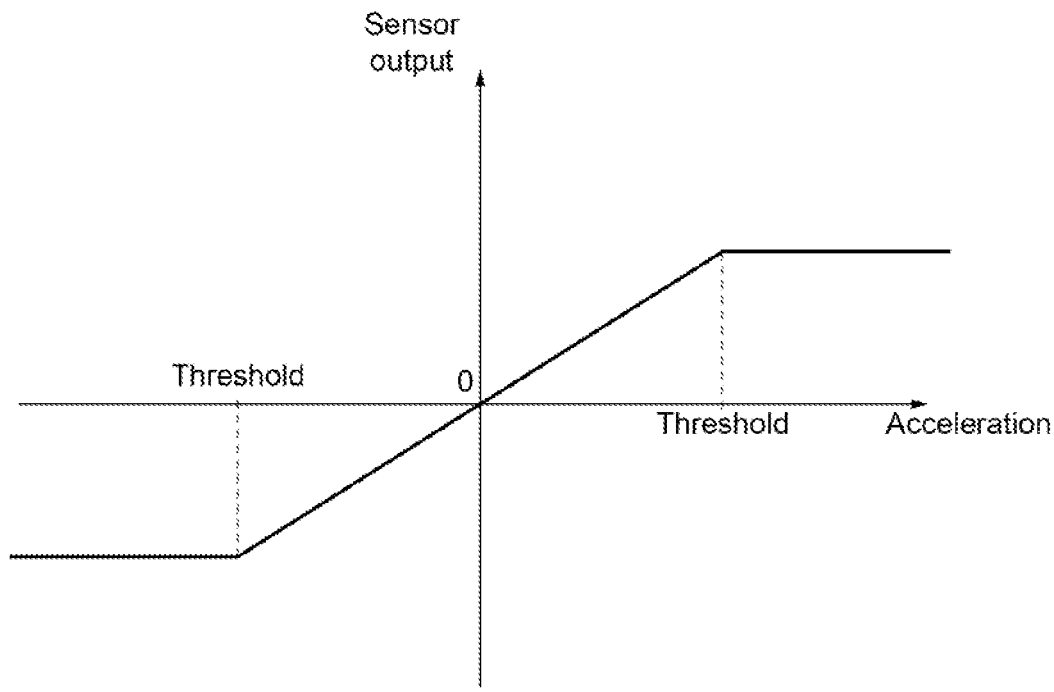
FIG. 6A is a graph that represents an electrical signal generated at output by the micromechanical device of FIG. 3 as a function of an acceleration to which the micromechanical device is subjected in use.

The sensor 150 has, instead, one seismic mass 153 and two sets 57, 159 of springs. It is possible to measure low accelerations via the deformations of the first spring assembly 57 caused by the seismic mass 153 (while the second spring assembly 159 is not stressed), and it is possible to measure high accelerations via the deformations, caused by the seismic mass 153, of both of the sets 57, 159 of springs. The elastic response of the sensor 150 can moreover be easily calculated via FEM (Finite-Element Modelling) simulations, in a per se known manner. In particular, as illustrated in FIG. 6A, the signal generated by the sensor 150 presents, as the acceleration increases (positive values), a first rectilinear stretch having a first slope followed by a second rectilinear stretch having a second slope, lower than the first slope. The first and second stretches are joined together in a continuous way (i.e., there is no zero-degree discontinuity but only a first-degree discontinuity). The plot of the signal generated by the sensor 150 at negative accelerations (i.e., decelerations) is specular (in particular, symmetrical with respect to the origin) to that of positive accelerations.

Figure 6B:
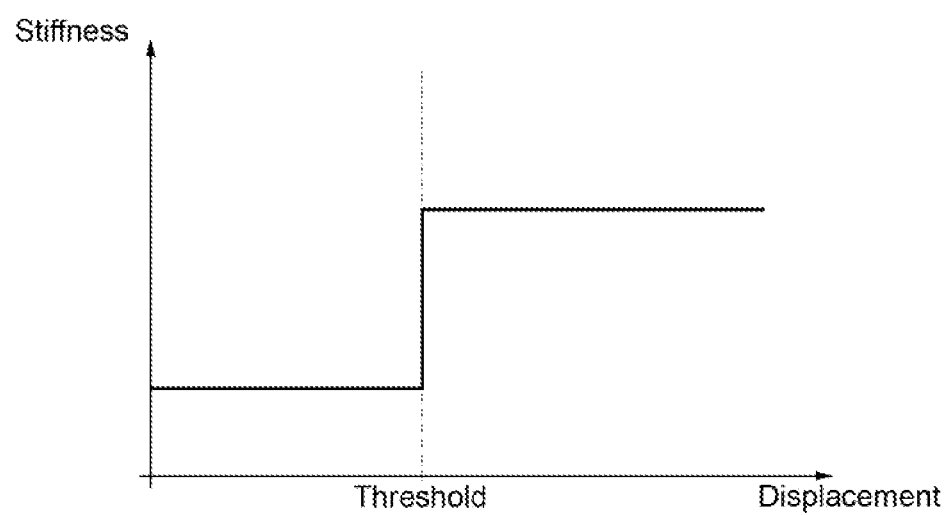
FIG. 6B is a graph that represents the plot of the stiffness of the micromechanical device of FIG. 4 as a function of a displacement of a sensing mass belonging to the micromechanical device with respect to a resting position.

The sensor 250 has a seismic mass 253 and a spring assembly 259. The nonlinear elastic response of the sensor 250 is obtained by the operation described of the stopper elements 266a and housing elements 266b, which modify, in use, the properties of the spring assembly 259: by reducing the number of turns of the spring assembly 259 that can withstand the stresses due to the external force applied (i.e., by reducing the number of active turns), the elasticity of the spring assembly 259 changes, and therefore the response of the sensor 250. In this case, as illustrated in FIG. 6B, the stiffness of the spring assembly 259 (and therefore, the overall stiffness of the sensor 250) presents, as the displacement of the seismic mass 253 increases, a first rectilinear stretch (which indicates a first stiffness) followed by a second rectilinear stretch (which indicates a second stiffness). These two stretches are separated from one another by a zero-degree discontinuity of the stiffness corresponding to the instant when the physical contact between the stopper elements 266a and housing elements 266 occurs.

The sensor 350 has two seismic masses 353, 355 and two sets 57, 359 of springs. The threshold mechanism that enables measurement of different ranges of acceleration is given by the physical contact of the second seismic mass 355 with the contact elements 380 fixed with respect to the semiconductor body 51, which decouples the seismic masses 353, 355 and causes activation of the second spring assembly 359. The response at output from the sensor 350 as a function of the acceleration is similar to the one described with reference to FIG. 6A for the sensor 150.

Furthermore, the elastic elements of the sensors discussed previously have a main extension and direction of deformation parallel to the surface 51a of the semiconductor body 51. In particular, the external force acts in the direction of deformation of the elastic elements. This enables distribution of the stresses on the elastic elements in an efficient way, thus reducing the likelihood of damage or failure thereof.

Finally, it is clear that modifications and variations may be made to the disclosure described and illustrated herein, without thereby departing from the scope of the present disclosure, as defined in the annexed claims.

In particular, the measurement structure 68 may be of an interdigitated type (i.e., it may include a plurality of first and second electrodes 68a, 68b facing one another to form an array), to improve measurement sensitivity. Moreover, the measurement structure 68 may be based upon an effect different from the capacitive one discussed previously. For instance, the measurement structure 68 may be a structure, of a type in itself known, that implements a detection of a resistive, piezoelectric, or optical type.

In addition, each stopper element 66a (equivalently, 166a and 266a, and each contact element 380a, 380b) may include a crowned portion adapted to improve contact with, and reduce the risk of its adhesion to, the respective housing element 66b (respectively, 166b and 266b, and the second mass 355) during mutual contact. In particular, the side walls of each stopper element may have a convex shape.

The abutment assemblies 66, 166, 266 may be in a number and occupy positions different from what has been described herein, as likewise the blocking elements 70.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micromechanical device, comprising:
a semiconductor body;
a plurality of fixed electrodes on the semiconductor body;
a first mobile structure including:
  a first mass having a first side opposite a second side, and a third side opposite a fourth side;
  a first stopper element extending from a first corner of the first mass;
  a second stopper element extending from a second corner of the first mass;
  a third stopper element extending from a third corner of the first mass;
  a fourth stopper element extending from a fourth corner of the first mass,
  a first electrode extending from the first mass at the first side, the first electrode being between the first and second stopper element; and
  a second electrode extending from the first mass at the second side, the second electrode being between the third and fourth stopper element; and
a second mobile structure including:
  a second mass;
  a central opening in the second mass, the first mass being in the central opening;
  a first recess from the central opening to a first side of the second mass, the first stopper element extending into the first recess;
  a second recess from the central opening to the first side of the second mass, the second stopper element extending into the second recess;
  a third recess from the central opening to a second side opposite the first side of the second mass, the third stopper element extending into the third recess;
  a fourth recess from the central opening to the second side of the second mass, the fourth stopper element extending into the fourth recess;
  a fifth recess from the central opening to the first side of the second mass, the first electrode extending into the fifth recess and being between a first one and a second one of the plurality of fixed electrodes; and
  a sixth recess from the central opening to the second side of the second mass, the second electrode extending into the sixth recess and being between a third one and a fourth one of the plurality of fixed electrodes.

2. The micromechanical device according to claim 1, wherein the second mass is greater than the first mass.

3. A micromechanical device, comprising:
a semiconductor body;
a first mobile structure including:
  a first mass;
  a plurality of stopper extensions extending from the first mass; and
  a plurality of electrode extensions extending from the first mass, each electrode extension being between two of the stopper extensions; and
a second mobile structure having a first side and a second side opposite one another, and a third and a fourth side opposite one another and transverse to the first and second sides of the second mobile structure, the second mobile structure including:
  a central opening;
  first, second, and third recesses extending from the central opening toward the first side of the second mobile structure, the first recess being larger than the second recess, the first recess being between the second and third recesses, a first one of the plurality of electrode extensions extending into the first recess;
  fourth, fifth, and sixth recesses extending from the central opening toward the second side of the second mobile structure, the fourth recess being larger than the fifth recess, the fourth recess being between the fifth and sixth recesses, ones of the plurality of stopper extensions extending into the second, third, fifth, and sixth recesses, a second one of the plurality of electrode extensions extending into the fourth recess;
  a seventh recess extending from the central opening toward the third side of the second mobile structure;

an eighth recess extending from the central opening toward the fourth side of the second mobile structure, the eight recess being opposite the seventh recess;

a first elastic assembly mechanically coupled to the first mobile structure and to the semiconductor body, the first elastic assembly being in the seventh recess;

a second elastic assembly mechanically coupled to the first mobile structure and to the semiconductor body, the second elastic assembly being in the eighth recess; and a first fixed electrode coupled to the semiconductor body and between the first and second mobile structures, the first fixed electrode being in the first recess of the second mobile structure.

4. A micromechanical device, comprising:
a semiconductor body;
a first mobile structure including:
   a first mass;
   a first stopper element extending from the first mass; and
   a first electrode extending from the first mass;
a second mobile structure including:
   a second mass larger than the first mass of the first mobile structure;
   an opening in a central region of the second mass, the first mass being in the opening of the second mass;
   a first recess extending from the opening to a first side of the second mobile structure, the first stopper element extending into the first recess; and
   a second recess extending from the opening to the first side of the second mobile structure, the second recess is larger than and opposite the first recess, the first electrode of the first mobile structure extending into the second recess of the second mobile structure;
a first fixed electrode coupled to the semiconductor body and between the first mobile structure and the second mobile structure, the first fixed electrode being in the second recess of the second mobile structure; and
a second fixed electrode coupled to the semiconductor body and between the first mobile structure and the second mobile structure, the second fixed electrode being in the second recess of the second mobile structure, the first electrode being between the first and second fixed electrodes.

5. The micromechanical device according to claim 4, comprising:
the first electrode of the first mobile structure, adapted to be biased at a first voltage, configured to oscillate with the first mobile structure; and
the first fixed electrode, adapted to be biased at a second voltage,
wherein the first electrode of the first mobile structure extends between, and is capacitively coupled to, the first and second fixed electrodes to form two respective capacitors with variable capacitance.

6. The micromechanical device according to claim 2, wherein the second mass includes a seventh recess extending from the central opening to a third side of the second mass, the third side being transverse to the first and second sides.

7. The micromechanical device according to claim 6, wherein the second mass includes an eighth recess extending from the central opening to a fourth side opposite the third side of the second mass.

8. The micromechanical device according to claim 7, comprising:
a first fixing element on the semiconductor body between the first and second mobile structures and in the seventh recess.

9. The micromechanical device according to claim 8, comprising a second fixing element on the semiconductor body between the first and second mobile structures and in the eighth recess.

10. The micromechanical device according to claim 9, comprising a first elastic assembly in the seventh recess that is coupled to the first fixing element.

11. The micromechanical device according to claim 10, comprising a second elastic assembly in the eighth recess that is coupled to the second fixing element.

12. The micromechanical device according to claim 11, comprising a plurality of blocking elements fixed to the semiconductor body, the plurality of blocking elements spaced apart from each other and positioned adjacent to each corner of the second mass.

13. The micromechanical device according to claim 3, wherein the second, third, fifth, and sixth recesses have first and second surfaces that are substantially parallel to the third and fourth sides of the second mobile structure.

14. The micromechanical device according to claim 13, wherein the plurality of stopper extensions is configured to contact the first or second surface of the second, third, fifth, and sixth recesses of the second mobile structure during operation.

15. The micromechanical device according to claim 4, wherein the second mobile structure includes a second side transverse the first side and a third recess extending from the opening of the second mobile structure towards the second side of the second mobile structure.

16. The micromechanical device according to claim 15, comprising a first fixing element in the third recess of the second mobile structure, the first fixing element coupled to the semiconductor body, and a first elastic assembly coupled to the first fixing element and the first mobile structure.

17. The micromechanical device according to claim 16, comprising a plurality of blocking elements coupled on the semiconductor body, the plurality of blocking elements being positioned at each of four corners of the second mobile structure.

18. The micromechanical device according to claim 17, comprising a second elastic assembly coupled to the second mobile structure, and a second fixing element coupled to the semiconductor body and the second elastic assembly, the first fixing element being between the first mass and the second fixing element.

* * * * *